US009736957B2

(12) United States Patent
Adams et al.

(10) Patent No.: US 9,736,957 B2
(45) Date of Patent: *Aug. 15, 2017

(54) HYBRID THERMOPLASTIC GELS AND THEIR METHODS OF MAKING

(71) Applicant: CommScope Technologies LLC, Hickory, NC (US)

(72) Inventors: Gary W. Adams, Holly Springs, NC (US); Julian S. Mullaney, Raleigh, NC (US); Michael A. Oar, San Francisco, CA (US)

(73) Assignee: CommScope Technologies LLC, Hickory, NC (US)

( * ) Notice: Subject to any disclaimer, the term of this patent is extended or adjusted under 35 U.S.C. 154(b) by 697 days.

This patent is subject to a terminal disclaimer.

(21) Appl. No.: 13/955,243

(22) Filed: Jul. 31, 2013

(65) Prior Publication Data

US 2014/0041893 A1   Feb. 13, 2014

Related U.S. Application Data

(60) Provisional application No. 61/681,940, filed on Aug. 10, 2012.

(51) Int. Cl.
| | | |
|---|---|---|
| *C08L 51/06* | (2006.01) | |
| *C08L 53/02* | (2006.01) | |
| *C08J 3/24* | (2006.01) | |
| *H05K 5/06* | (2006.01) | |
| *C08F 299/02* | (2006.01) | |
| *C08L 53/00* | (2006.01) | |
| *C08J 5/00* | (2006.01) | |
| *C09K 3/10* | (2006.01) | |
| *C08L 61/06* | (2006.01) | |
| *C08L 25/08* | (2006.01) | |
| *C08L 23/22* | (2006.01) | |

(52) U.S. Cl.
CPC ......... *H05K 5/065* (2013.01); *C08F 299/02* (2013.01); *C08J 5/00* (2013.01); *C08L 53/005* (2013.01); *C08L 61/06* (2013.01); *C09K 3/10* (2013.01); *H05K 5/062* (2013.01); *C08G 2220/00* (2013.01); *C08J 3/246* (2013.01); *C08L 23/22* (2013.01); *C08L 25/08* (2013.01); *C09K 2003/1068* (2013.01); *C09K 2200/0617* (2013.01); *C09K 2200/0642* (2013.01); *Y10T 428/1352* (2015.01)

(58) Field of Classification Search
CPC ..... H05K 5/065; C08L 51/003; C08L 51/006; C08L 51/06; C08L 53/005; C08L 53/02; C08L 53/025; C08L 23/22; C08L 25/08; C09K 3/10; C09K 2200/0617; C09K 2200/0632; C09K 2200/0642; C08J 3/246; C08G 2220/00
See application file for complete search history.

(56) References Cited

U.S. PATENT DOCUMENTS

| | | | | |
|---|---|---|---|---|
| 5,910,530 | A * | 6/1999 | Wang | ........................ C08F 8/32 524/534 |
| 6,207,752 | B1 | 3/2001 | Abraham et al. | |
| 2004/0192874 | A1* | 9/2004 | Walker | .................. C08G 77/50 528/32 |
| 2009/0060445 | A1 | 3/2009 | Mullaney et al. | |
| 2009/0186958 | A1 | 7/2009 | St. Clair | |
| 2012/0126455 | A1 | 5/2012 | Ellsworth et al. | |
| 2012/0129962 | A1 | 5/2012 | Ellsworth et al. | |
| 2012/0130011 | A1 | 5/2012 | Ellsworth et al. | |

FOREIGN PATENT DOCUMENTS

| | | |
|---|---|---|
| EP | 0 371 641 A1 | 6/1990 |
| EP | 0 879 832 A1 | 11/1998 |
| JP | 55-73743 | 6/1980 |
| WO | WO 96/23007 * | 1/1996 |
| WO | WO 96/23007 | 8/1996 |

OTHER PUBLICATIONS

Additives for Plastics: Edition 1, published by D.A.T.A., Inc. and The International Plastics Selector, Inc., 8 pages (copyright 1987).
International Search Report and Written Opinion for PCT/US2013/052844 mailed Jan. 22, 2014.
St. Clair, D., "Temp Service," Adhesives Age, pp. 31-40 (Sep. 2001).
Sunoco Sundex 790 Product Information, dated Jun. 2009, 1 page total.
Licomont® CaV 102 Technical Data, dated May 2013, 2 pages total.
Aluminum acetylacetonate ReagentPlus®, 99% Product Specification, dated Dec. 16, 2010, 1 page total.
Kraton MD6684 Material Safety Data Sheet, dated Feb. 26, 2007, 7 pages total.
Kraton®, G1701 M Polymer Data Document, dated Aug. 4, 2009, 2 pages total.

(Continued)

Primary Examiner — Roberto Rabago
(74) Attorney, Agent, or Firm — Merchant & Gould P.C.

(57) ABSTRACT

Methods, compositions, apparatuses, and systems are provided for a hybrid thermoplastic gel or sealant. The methods comprise providing (a) a base polymer having at least one functional group capable of crosslinking, (b) a functionalized extender, and (c) heat, and reacting the base polymer and functionalized extender in the presence of the heat to form the hybrid thermoplastic gel. The gel composition may comprise 5-40 wt % of a base polymer, 60-95 wt % of a functionalized extender, and 0-10 wt % of a crosslinker. A closure or interconnect system may comprise a housing, a cable, and a hybrid thermoplastic gel or sealant. A telecommunications apparatus may comprise a telecommunications component and a sealant that forms a seal with the telecommunications component. The sealant may comprise a sealant material having a first range of elongation followed by a second range of elongation.

26 Claims, 11 Drawing Sheets

(56) References Cited

OTHER PUBLICATIONS

Office Action issued Apr. 20, 2016 in corresponding Chinese patent application No. 201380042346.1 and English language translation thereof, 12 pages total.

* cited by examiner

HYBRID THERMOPLASTIC GELS AND THEIR METHODS OF MAKING

CROSS-REFERENCE TO RELATED APPLICATIONS

This application claims the benefit of U.S. Provisional Patent Application No. 61/681,940, filed Aug. 10, 2012, which is incorporated herein by reference.

BACKGROUND

In today's modern electrical and electronic devices, as well as in other uses such as fiber optic connections, sealants are often used for insulation, for protection against water, corrosion and environmental degradation, optical index matching, and thermal management. Prior to now, a number of sealants including gels have been known, however, processing gels in a cost effective, efficient, and effective manner has been a challenge.

As technology progresses, sealants will be subjected to increasingly higher temperature environments and more demanding performance requirements. There has been, and there presently exists, a need for high performance sealants to meet these demands. For example, there is an increasing need for high service gel sealants for use in outdoor energy transmission applications and for use near engine compartments.

In particular, closure systems are used to protect internal components from degradation caused by external environments. For example, internal components such as fiber optic cables and copper cables are often enclosed in closure systems. Examples of commercially available closure systems include the Outdoor Fiber Drop Repair (OFDR), the Outdoor Fiber Distribution Closure (OFDC), and the Fiber optic Infrastructure System Technology (FIST), available from Tyco Electronics, Kessel-Lo, Belgium. In particular, the OFDR Closure is used to break out fibers from a looped fiber optic cable to connect users such as business customers or persons in multiple or single living units. These types of closures can be used in aerial, pedestal, and underground environments. Other closure systems are commercially available for use with communication and energy transmission cables.

Closure systems typically include internal components such as fiber organizers, cable seals and termination devices, drop cable seals for a number of drops with drop cable termination devices, and universal splice holders for a number of splices. These internal components may be subject to environmental factors such as varying moisture levels, heat and cold, and exposure to other chemical substances. The closure systems are preferably protected from damage with a sealant of some sort. Conventional sealants, however, suffer from a number of drawbacks that make them unsuitable for certain closure systems.

Sealants are often used for insulation and for protection against water, corrosion and environmental degradation, and for thermal management. Prior to now, a number of sealants have been known; however, currently available sealants have certain drawbacks and disadvantages that make them inadequate for specific uses and for use in contact with certain materials. In particular, there is an unmet need for sealants that are suitable for fiber optic and electronic closure systems.

Suitable sealing systems for closures are needed for use with a variety of different cables. For examples, a sealing system is needed for cables termed Low Smoke Zero Halogen ("LSZH"), also known as Low Smoke Halogen Free ("LSHF"), Low Smoke Zero Halogen ("LSOH"), and Zero Halogen Low Smoke ("OHLS") among other things.

LSZH cables are characterized by containing no halogenated flame-retardants, and produce relatively limited amounts of smoke when exposed to sources of heat such as a flame or heated wires. LSZH cables provide an alternative to the frequently used polyethylene, PVC, or thermoplastic urethane coatings. Polyethylene, PVC, or thermoplastic urethane, when they contain halogens, may produce hazardous halogen-containing compounds such as HCl or HBr gas. An improvement to current LSZH cable closure systems is needed to enhance performance in environmentally sensitive environments.

Traditionally, thermoplastic elastomer gels (TPEGs) have been used as sealants in certain applications, including LSZH closure systems, due to their unique properties. TPEGs have provided many years of reliable in-field performance for applications requiring a low maximum service temperature of approximately 70° C. TPEGs may comprise a styrene ethylene/butylene styrene ("SEBS") triblock copolymer swollen with a mineral oil softener. While the thermoplastic nature of these gels allows for easy production, it limits the upper service temperature due to creep and flow as in-field ambient temperatures approach the styrene glass transition. Research has been aimed at increasing the upper service temperature of these gels through chemically crosslinking the gel network in order to form a thermoset gel structure. For example, oil-swelled acid/anhydride modified maleic anhydride SEBS gels have been covalently cross-linked using small molecule crosslinkers like di- and tri-amines, EP 0879832A1, as well as with some metal salts, D. J. St. Clair, "Temp Service," Adhesives Age, pp. 31-40, September 2001. Crosslinked polymers are known to increase thermal stability, toughness, and chemical resistance compared to their base, or uncrosslinked polymers. However, crosslinked polymers are also known to often be intractable, making them difficult to reprocess or recycle.

A problem, however, with thermoplastic gels used as sealants, and in closure systems in general, is that they often contain high amounts of mineral oil. One observed problem is that certain flame retardant additives, such as ethylene vinyl acetate (EVA), may bond to the mineral oil and make the jacket cable of the closure system fairly rigid and degrade, making the closure susceptible to leaking oil. The oil in these gels may leak from the gel and cause deterioration, discoloring, or degradation of the cable in the closure system. In some extreme cases, a cable may even snap under compression due to the damage done by the oil leaking from the thermoplastic gel. Accordingly there exists an unmet need for gels, sealants, and closure systems with suitable hardness, viscoelastic properties, low permanent set or compression set, long-term performance (e.g., >20 years), amongst other properties, including compatibility with EVA and LSZH cables.

BRIEF SUMMARY

In one embodiment, a method is provided for making a hybrid thermoplastic gel comprising providing a base polymer having at least one functional group capable of crosslinking, providing a functionalized extender, and providing heat. The method further comprises reacting the base polymer and functionalized extender in the presence of the heat to form the hybrid thermoplastic gel.

The method may further comprise providing a crosslinker having multiple functional groups that are compatible and willing to react with the functional groups in the base polymer or functionalized extender. Also, the method may further comprise providing at least one additive selected from the group consisting of: flame retardants, coloring agents, adhesion promoters, stabilizers, fillers, dispersants, flow improvers, plasticizers, slip agents, toughening agents, and combinations thereof.

Additionally, the method may further comprise providing between 0.1 wt % and 5 wt % of a stabilizer. In some embodiments, the stabilizer is selected from the group consisting of antioxidants, acid-scavengers, light and UV absorbers/stabilizers, heat stabilizers, metal deactivators, free radical scavengers, carbon black, antifungal agents, and mixtures thereof.

In some embodiments the base polymer comprises a styrenic block copolymer. The styrenic block copolymer may be a styrene-ethylene/butylene-styrene, styrene-ethylene/propylene-styrene copolymer or styrene butadiene styrene (SBS). In other embodiments, the base polymer comprises a maleated base polymer.

In some embodiments, the functionalized extender comprises a single olefin at a terminal position on the extender. In one embodiment, the functionalized extender is a polyisobutylene. In another embodiment, the functionalized extender is a maleated extender. The maleated extender may be a maleated polyisobutylene.

In certain embodiments the gel comprises one or more of the following properties: (a) hardness between 80 g and 300 g; (b) a stress relaxation between 20% and 65% when the gel is subjected to a deformation of 50% of its original size; (c) a compression set between 4% and 20% after 50% strain has applied to the gel for 1000 hours at 70° C.; and (d) less than 10% oil bleed out after being under compression of 1.2 atm for 60 days at 60° C.

In another embodiment, a hybrid thermoplastic gel is provided comprising 5-40 wt % of a base polymer having at least one functional group capable of crosslinking. The gel further comprises 60-95 wt % of a functionalized extender. The gel further comprises 0-10 wt % of a crosslinker having multiple functional groups that are compatible and willing to react with the functional groups in the base polymer or the functionalized extender. The gel may further comprise at least one additive selected from the group consisting of: flame retardants, coloring agents, adhesion promoters, stabilizers, fillers, dispersants, flow improvers, plasticizers, slip agents, toughening agents, and combinations thereof.

In some embodiments, the gel comprises between 0.1 wt % and 5 wt % of a stabilizer. The stabilizer may be selected from the group consisting of antioxidants, acid-scavengers, light and UV absorbers/stabilizers, heat stabilizers, metal deactivators, free radical scavengers, carbon black, antifungal agents, and mixtures thereof.

In certain embodiments, the crosslinker is a covalent crosslinker selected from the group consisting of primary amines, secondary amines, tertiary amines, epoxies, hydroxyl-terminated butadienes, polymeric di-isocynates, and mixtures thereof. In one embodiment, the crosslinker is an ionic crosslinker. The ionic crosslinker may be a metal salt selected from the group consisting of aluminum acetylacetonate, iron acetylacetonate, zinc acetylacetonate, titanium acetylacetonate and zirconium acetylacetonate, aluminum triacetate, aluminium diacetate, aluminium monoacetate, tetra(2-ethylhexyl)titanate, and mixtures thereof. In some embodiments, the crosslinker is an amine crosslinker selected from the group consisting of ethylene diamine; 1,2- and 1,3-propylene diamine; 1,4-diaminobutane; 2,2-dimethylpropane diamine-(1,3); 1,6-diaminohexane; 2,5-dimethylhexane diamine-(2,5); 2,2,4-trimethylhexane diamine-(1,6); 1,8-diaminooctane; 1,10-diaminodecane; 1,11-undecane diamine; 1,12-dodecane diamine; 1-methyl-4-(aminoisopropyl)-cyclohexylamine-1; 3-aminomethyl-3,5,5-trimethyl-cyclohexylamine-(1); 1,2-bis-(aminomethyl)-cyclobutane; p-xylylene diamine; 1,2- and 1,4-diaminocyclohexane; 1,2-; 1,4-; 1,5- and 1,8-diaminodecalin; 1-methyl-4-aminoisopropyl-cyclohexylamine-1; 4,4'-diamino-dicyclohexyl; 4,4'-diamino-dicyclohexyl methane; 2,2'-(bis-4-amino-cyclohexyl)-propane; 3,3'-dimethyl-4,4'-diamino-dicyclohexyl methane; 1,2-bis-(4-aminocyclohexyl)-ethane; 3,3',5,540-tetramethyl-bis-(4-aminocyclohexyl)-methane and -propane; 1,4-bis-(2-aminoethyl)-benzene; benzidine; 4,4'-thiodianiline, dianisidine; 2,4-toluenediamine, diaminoditolylsulfone; 2,6-diaminopyridine; 4-methoxy-6-methyl-m-phenylenediamine; diaminodiphenyl ether; 4,4'-bis(o-toluidine); o-phenylenediamine; o-phenylenediamine, methylenebis(o-chloroaniline); bis(3,4-diaminiophenyl)sulfone; diaminiodiphenylsulfone; 4-chloro-o-phenylenediamine; m-aminobenzylamine; m-phenylenediamine; 4,4'-methylenedianiline; aniline-formaldehyde resin; trimethylene glycol di-p-aminobenzoate; bis-(2-aminoethyl)-amine; bis-(3-aminopropyl)-amine; bis-(4-aminobutyl)-amine; bis-(6-aminohexyl)-amine; isomeric mixtures of dipropylene triamine and dibutylene triamine; and mixtures thereof.

In other embodiments, the crosslinker is a polyol crosslinker selected from the group consisting of 1,2-propanediol, 1,3-propanediol, diethanolamine, triethanolamine, N,N,N', N'-[tetrakis(2-hydroxyethyl)ethylene diamine], N,N,-diethanolaniline, polycaprolactone diol, poly(propylene glycol), poly(ethylene glycol), poly(tetramethylene glycol), and polybutadiene diol and their derivatives or copolymers, and mixtures thereof.

In certain embodiments, the base polymer comprises a styrenic block copolymer. The styrenic block copolymer may be a styrene-ethylene/butylene-styrene, styrene-ethylene/propylene-styrene copolymer or styrene butadiene styrene. In other embodiments, the base polymer comprises a maleated base polymer.

In certain embodiments, the functionalized extender comprises a single olefin at a terminal position on the extender. The functionalized extender may be a polyisobutylene. The functionalized extender may also be a maleated extender, such as a maleated polyisobutylene.

In certain embodiments, the gel comprises one or more of the following properties: (a) hardness between 80 g and 300 g; (b) a stress relaxation between 20% and 65% when the gel is subjected to a deformation of 50% of its original size; (c) a compression set between 4% and 20% after 50% strain has applied to the gel for 1000 hours at 70° C.; and (d) less than 10% oil bleed out after being under compression of 1.2 atm for 60 days at 60° C.

In another embodiment, a closure or interconnect system is provided comprising a housing, a cable, and a hybrid thermoplastic gel. The closure or interconnect system is made by reacting a functionalized extender, and a base polymer having at least one functional group capable of crosslinking.

In some embodiments, the gel in the system further comprises a crosslinker having multiple functional groups that are compatible and willing to react with the functional groups in the base polymer or functionalized extender. The gel may be compatible with a LSZH cable as determined by a pressure loss test or tightness test following at least one of the following mechanical or environmental tests: axial tension test, flexure test, re-entry test, torsion test, resistance to aggressive media test, resistance to stress cracking test, salt fog test, temperature cycling test, and waterhead test. In some embodiments, the gel in the system has less than 10% oil bleed out after being under compression of 1.2 atm for 60 days at 60° C. In other embodiments, the gel in the system has less than 5% oil bleed out after being under compression of 1.2 atm for 60 days at 60° C. In yet other embodiments, the closure or interconnect system further comprises a connector and a receptacle for the connector.

In an additional embodiment, a telecommunications apparatus is provided comprising a telecommunications component. The apparatus further comprises a sealant that forms a seal with the telecommunications component, the sealant having a first range of elongation followed by a second range of elongation, the sealant having a stress-strain profile having a first stress-strain slope corresponding to the first range of elongation and a second stress-strain slope corresponding to the second range of elongation, the second stress-strain slope being steeper than the first stress-strain slope. In certain embodiments, a transition area or slope exists between the first stress-strain slope and the second stress-strain slope. In certain embodiments, the telecommunications component is a cable. In some embodiments, the telecommunications component comprises a housing.

In another embodiment, a sealant is provided comprising a sealant material having a first range of elongation followed by a second range of elongation, the sealant material having a stress-strain profile having a first stress-strain slope corresponding to the first range of elongation and a second stress-strain slope corresponding to the second range of elongation, the second stress-strain slope being steeper than the first stress-strain slope. As previously noted, a transition area or slope may exist between the first stress-strain slope and the second stress-strain slope.

In yet another embodiment, an enclosure is provided comprising a housing defining an opening. The enclosure further comprises a sealant arrangement positioned within the opening of the housing, the sealant arrangement defining at least one cable port, the sealant arrangement including a sealant material having a first range of elongation followed by a second range of elongation, the sealant material having a stress-strain profile having a first stress-strain slope corresponding to the first range of elongation and a second stress-strain slope corresponding to the second range of elongation, the second stress-strain slope being steeper than the first stress-strain slope. The enclosure further comprises an actuation arrangement for pressurizing the sealant material within the opening of the housing. In certain embodiments, the actuation arrangement includes a spring for pressurizing the sealant material.

DETAILED DESCRIPTION

Figure 1:
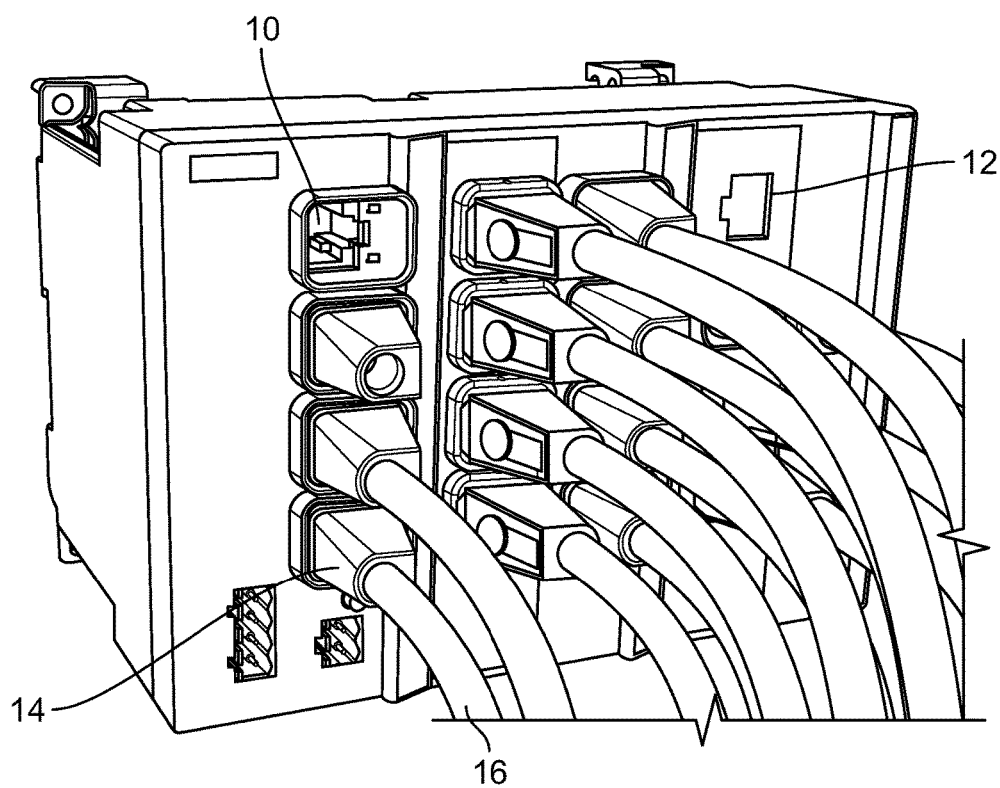
FIG. 1 is a depiction of an interconnect system having a connection hub having multiple connection ports or receptacles for the connector, housing, and cable components to be connected.

As used herein, terms such as "typically" are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

As used herein, the terms "comprise(s)," "include(s)," "having," "has," "contain(s)," and variants thereof, are intended to be open-ended transitional phrases, terms, or words that do not preclude the possibility of additional acts or structure.

As used herein, the term "polymer" may refer to a polymeric compound prepared by polymerizing monomers, whether of the same or a different type. The generic term "polymer" embraces the terms "homopolymer," "copolymer," and the like.

As used herein, the term "functionalized extender" may refer to any compound having a functional group that is compatible and willing to react with a functional group in the base polymer or the crosslinker/coupling agent. In certain embodiments, the term refers to any compound comprising a single functional site that is capable of forming a connection to a base polymer or a crosslinker/coupling agent. In certain embodiments, the functionalized extender is a maleated extender, such as maleated polyisobutylene.

Any concentration range, percentage range, or ratio range recited herein are to be understood to include concentrations, percentages, or ratios of any integer within that range and fractions thereof, such as one tenth and one hundredth of an integer, unless otherwise indicated. Also, any number range recited herein relating to any physical feature are to be understood to include any integer within the recited range, unless otherwise indicated. It should be understood that the terms "a" and "an" as used above and elsewhere herein refer to "one or more" of the enumerated components. For example, "a" polymer refers to one polymer or a mixture comprising two or more polymers.

In certain embodiments, the hybrid thermoplastic gel is made through the mixture and reaction of a base polymer with a functionalized extender in the presence of heat (i.e., wherein the reaction is conducted at an elevated temperature greater than 25° C.). In some embodiments, the gel further comprises a crosslinker, wherein the gel is made through the reaction of a base polymer, functionalized extender, and crosslinker in the presence of heat.

Making the Hybrid Thermoplastic Gel

In certain embodiments, the hybrid thermoplastic gel is prepared by mixing between 5-40 wt % base polymer, 60-95 wt % functional extender, and 0-10 wt % crosslinker (or coupling agent). In another embodiment, the gel is prepared by mixing 10-30 wt % base polymer, 70-90 wt % functional extender, and 0.1-5 wt % crosslinker. In yet another embodiment, the gel is prepared by mixing 15-25 wt % base polymer, 75-85 wt % functional extender, and 0.5-3.5 wt % crosslinker.

In certain embodiments, the gel components are mixed together at an elevated temperature (i.e., greater than room temperature) for a certain period of time. The temperature and time at temperature may be adjusted accordingly to target the end properties desired in the gel. Several of those properties are discussed in the section below labeled "Uses and Properties of the Hybrid Thermoplastic Gel." In certain embodiments, the mixing and reacting is conducted at an elevated temperature between 100-250° C., 150-220° C., or 180-200° C. In some embodiments, the mixing at the elevated temperature is held for 1-12 hours, 2-8 hours, or 3-6 hours.

In certain embodiments, no catalyst or initiator is needed other than heat to react the base polymer, functionalized extender, and/or crosslinker together to form the hybrid thermoplastic gel. For example, certain ionic crosslinkers (described below in greater detail) may only need heat and time to react and form the gel.

In certain embodiments, an additive or additives may also be added to the gel composition. In certain embodiments, the additive may comprise between 0.1-30 wt % of the overall composition, 1-25 wt % of the overall gel composition, or 5-20 wt % of the overall composition. In particular, the gel may include a stabilizer comprising between 0.1-5 wt %, 0.5-3 wt %, or 1-2 wt % of the overall gel composition.

In some embodiments, the base polymer and/or functionalized extender are maleated prior to the mixing discussed above. The maleated reaction of the base polymer and/or functionalized extender is discussed in greater detail below.

Base Polymer

In certain embodiments, the base polymer comprises at least one functional group configured to chemically crosslink in the presence of an extender or crosslinker. For example, the base polymer may have functional groups such as acyls, hydroxyls, sulfhydryls, amines, carboxyls, anhydrides, olefins, and carboxylic acids configured to chemically link in the presence of an extender or crosslinker.

In some embodiments, the base polymer is a styrenic block copolymer. In certain embodiments, the styrenic block copolymer is a styrene-ethylene/butylene-styrene ("SEBS"), styrene-ethylene/propylene-styrene ("SEPS") copolymer or styrene butadiene styrene (SBS). In yet other embodiments, the base polymer is a olefinic block copolymer, such as those described in U.S. Patent Application No. 2012/0130011, herein incorporated by reference in its entirety. For example, the olefinic block copolymers may be an elastomeric copolymers of polyethylene, sold under the trade name INFUSE by The Dow Chemical Company of Midland, Mich. (e.g., INFUSE 9107). In one embodiment, the olefinic block copolymer is selected from the group consisting of INFUSE OBC 9000, INFUSE OBC 9007, INFUSE OBC 9100, INFUSE OBC 9107, INFUSE OBC 9500, INFUSE OBC 9507, INFUSE OBC 9530, INFUSE OBC 9807, INFUSE OBC 9817, and mixtures thereof.

In other particular examples, the base polymer may be any such configured polymers such as those available from Kraton Polymers (Houston, Tex.), including but not limited to: Kraton MD6684, RP6684, FG190, FG1924, RP6670, 1901, 1901X, B 51-4, FG 120LX, FG 1652, FG 19, FG 1900X, FG 1901, FG 1901X, FG 1901X951, FG 1921X, FG 1924, FG 1924X, FG 1961X, G 1901, G 1901X, G 1901X2, G 1921, GRP 6627, KG 1901, M 1923, MB 1000, RP 6509, RP 6510, RP 6543, RP 6562. In other embodiments, the base polymer may be at least one of the following available from Asahi Kasei Elastomer (Tokyo, Japan): Asahi M 1913, M 1943, and M 1953.

In other embodiments, the base polymer may further include at least one of the following commercially available copolymers, including hydrogenated styrenic block copolymers such as the polystyrene-poly(ethylene-propylene) diblock copolymers available from Kraton Polymers as KRATON G1701 and G1702; the polystyrene-poly(ethylene-butylene)-polystyrene triblock copolymers available from Kraton Polymers as KRATON G1641, G1650, G1651, G1654, G1657, G1726, G4609, G4610, GRP-6598, RP-6924, MD-6932M, MD-6933, and MD-6939; the polystyrene-poly(ethylene-butylene-styrene)-polystyrene (S-EB/S-S) triblock copolymers available from Kraton Polymers as KRATON RP-6935 and RP-6936, the polystyrene-poly(ethylene-propylene)-polystyrene triblock copolymers available from Kraton Polymers as KRATON G1730; the polystyrene-poly(ethylene-butylene)-polystyrene triblock copolymer comprising 67 wt % polystyrene available from Asahi Kasei Elastomer as TUFTEC H1043; the polystyrene-poly(ethylene-butylene)-polystyrene triblock copolymer comprising 42 weight percent polystyrene available from Asahi Kasei Elastomer as TUFTEC H1051; the polystyrene-poly(butadiene-butylene)-polystyrene triblock copolymers available from Asahi Kasei Elastomer as TUFTEC P1000 and 2000; the polystyrene-polybutadiene-poly(styrene-butadiene)-polybutadiene block copolymer available from Asahi Kasei Elastomer as S.O.E.-SS L601; the polystyrene-poly(ethylene-butylene)-polystyrene triblock copolymer comprising about 60 wt % polystyrene available from Kuraray as SEPTON S8104; the polystyrene-poly(ethylene-ethylene/propylene)-polystyrene triblock copolymers available from Kuraray as SEPTON® S4044, S4055, S4077, and S4099; and the polystyrene-poly(ethylene-propylene)-polystyrene triblock copolymer comprising about 65 wt % polystyrene available from Kuraray as SEPTON® S2104. Mixtures of two or more block copolymers may be used. Illustrative commercially available unhydrogenated block copolymers include the Kraton D series polymers, including KRATON D1101 and D1102, from Kraton Polymers, and the styrene-butadiene radial teleblock copolymers available as, for example, K-RESIN KR01, KR03, KR05, and KR10 sold by Chevron Phillips Chemical Company. In another embodiment, the styrenic block copolymer is a mixture of high melt viscosity SEBS block copolymer and a functionalized SEBS block copolymer.

In another embodiment, the base polymer comprises maleic anhydride grafted to the block copolymer. The maleated functional groups are examples of functional groups configured for crosslinking during gel processing. These maleated base polymers are particularly configured for crosslinking with extenders, di- and multi-amine crosslinkers, di- and multi-functional epoxies, di- and multi-functional hydroxyl molecules (alcohols and polyols) as well as aluminum, titanium and other organometallic compounds. In some embodiments, the maleated base polymer includes at least one functional group configured to chemically crosslink with a di- and multi-amine crosslinker.

For further example, the maleated functional groups of a maleic anhydride-modified SEBS or SEPS are configured for crosslinking. Not wishing to bound by theory, but it is believed that chemical crosslinking of the SEBS or SEPS triblocks at the ethylene-butylene or ethylene-propylene blocks further strengthens the gel structure. The chemical crosslinking produced is capable of raising its softening temperature.

Methods of preparing maleated block copolymers are known in the art and many such block copolymers are commercially available. For example, maleated block copolymers are disclosed in EP 0879832A1. Illustrative commercially available maleic anhydride-modified SEBS are available from Kraton Polymers (Houston, Tex.) as KRATON FG1901 (SEBS polymer having a polystyrene content of about 30 wt % and maleic anhydride grafted content of about 1.4-2.0 wt %) and KRATON FG 1924 G (SEBS polymer with about 13 wt % polystyrene and maleic anhydride grafted content of about 0.7-1.3 wt %), and KRATON MD 6684 CS (SEBS polymer having a polystyrene content of about 30 wt % and maleation level of about 1.0 wt %), and KRATON MD 6670. Illustrative commercially available maleic anhydride-modified SEBS are available from Asahi Chemical Industry Co., Ltd. (Tokyo, Japan) under the trade name M-1911 (maleation level of about 3.0 wt %), M-1913 (maleation level of about 2.0 wt %), and M-1943.

In one embodiment, the maleic anhydride modified SEBS is KRATON MD6684CS. In another embodiment, the maleic anhydride-modified SEBS is KRATON FG6684. In yet another embodiment, the maleic anhydride modified SEBS is selected from the group consisting of as KRATON FG1901, KRATON FG 1924 G, KRATON MD 6684 CS, and KRATON MD 6670. In another embodiment, the maleic anhydride-modified SEBS has a maleation level of between 1.0 wt % and 3.0 wt %.

Functionalized Extender

In certain embodiments, the hybrid thermoplastic gel includes a functionalized extender that is capable of forming a connection with the base polymer and "extend" the length of the base polymer. In certain embodiments, the functionalized extender comprises at least one functional group that is compatible and willing to react with a functional group in the base polymer or the crosslinker/coupling agent. In certain embodiments, the functionalized extender may be any compound that comprises a functional site that is capable of forming a connection to the base polymer or the crosslinker/coupling agent. The functional group may be an olefin, for example.

In some embodiments, the functionalized extender comprises an internal olefin. In other embodiments, the functionalized extender comprises a terminal double bond (α-olefin). In certain embodiments, the functionalized extender includes only one functional group. In some embodiments, the functionalized extender comprises a single, terminal olefin. Not wishing to bound by theory, but it is believed that when the functionalized extender includes only one functional group per molecule (such as a terminal double bond), then a highly crosslinked structure can be prevented by the stoichiometry of the components, and the resulting gel can be melt processed more readily. A functionalized extender containing only one functional group can assist in locking the extender into the gel structure and prevent the extender from bleeding out as readily as similar gels made with non-functionalized (non-reactive) extenders.

In other embodiments, the functionalized extender comprises more than one functional group. The functionalized extender may comprise a compound having more than one olefinic site such as a butadiene. In one particular embodiment, the functionalized extender comprises a carboxy-terminated butadiene compound.

In certain embodiments, the extender can be locked into the gel structure either by making it physically or chemically attracted to the polymeric or functional portion of the base polymer, or by adding a crosslinker (or coupling agent) that connects the functionalized extender to the base polymer. In a preferred embodiment, the functionalized extender is connected to the base polymer (either directly or through a coupling agent) in only one location per extender molecule.

In some embodiments, the functionalized extender is selected from the group consisting of: polyisobutylene, unsaturated hydrocarbon oils, unsaturated paraffins, alkenes or olefins, unsaturated naturals oils such as castor, linseed, soybean, peanut, esters or phthalate esters, polybutadiene, polyisoprene, poly(butadiene/styrene) copolymers, other liquid rubbers, and mixtures thereof. In one embodiment, the functionalized extender is polyisobutylene.

In certain embodiments, the functionalized extender is a maleated extender, such as maleated polyisobutylene or maleated polybutadiene. In one particular embodiment, the functionalized extender is maleated polyisobutylene. In some embodiments, the extender compound is reacted with maleic anhydride to form a maleated extender. In one particular example, about 45 g of maleic anhydride is added to about 500 g of heated polyisobutylene (TPC 595 from Texas Petrochemicals, Houston, Tex.), wherein the reaction is carried out at 190° C. for 6 hours. The hot maleated polyisobutylene is then filtered through a 200 mesh filter to remove any charred particles, and then put in sealed glass containers under dry nitrogen. The resulting composition was approximately 80% maleated as determined by the stoichiometry of the ingredients and average molecular weight of the polyisobutylene. Other functionalized extenders (including other polyisobutylene compositions such as Indopol® H100 polyisobutylene, INEOS Oligomers, League City, Tex., or Glissopal 1300 from BASF) may also maleated using a similar procedure.

Crosslinker/Coupling Agent

In certain embodiments, the hybrid thermoplastic gel includes a crosslinker or coupling agent that is capable of forming connections between the base polymer chains, between the base polymer and functionalized extender, or between functionalized extenders. In certain embodiments, the crosslinker comprises multiple (2 or more) functional groups that are compatible and willing to react with the functional groups in the base polymer or functionalized extender. In certain embodiments, the crosslinker comprises between three and ten functional groups that are capable of forming a connection point between three and ten base polymers or functionalized extenders, such that the crosslinker functions as a branching agent. In another embodiment, the crosslinker comprises four functional groups that are capable of forming a connection point between four different base polymers or functionalized extenders.

Any crosslinker capable of reacting with the functionalized base polymer regions can be utilized, such as covalent bond crosslinking (covalent crosslinkers) or ionic bond crosslinking (ionic crosslinkers).

In certain embodiments, the crosslinker is an ionic crosslinker, which may allow for improved re-melting or re-processing the gel by breaking or disassociating the bond at an elevated temperature. In certain embodiments, an ionic crosslinked hybrid gel may be re-melted or re-processed by placing the gel sample in a picture frame mold (in some cases, a mold that is has dimensions of about 200 mm by 200 mm by 3 mm with sheets of release paper or film on each side of the gel samples, wherein the total amount of gel placed in the mold is 60 g). The material may then be pressed in a heated hydraulic press for 2-3 minutes (or until melted) at about 180° C. and 10000 pounds of force. The sample may then be cooled to room temperature and removed. Samples of other shapes can be molded in a manner similar to injection molding plastic. In some embodiments, the re-melting/re-processing temperatures may range between about 190° C. and 230° C., and the pressures may range between about 300 psi and 1000 psi depending on the size and geometry of the sample. Plastic injection molding machines, pressurized drum melters, and gear pumps may all be used to melt gel and pressurize the gel to force it into the desired mold.

In some embodiments, the ionic crosslinker is a metal salt. Organic metal salts may aid in coupling the (maleated) extender to the base polymer molecules. In certain embodiments, the metal salt is a lithium, sodium, calcium, aluminum, or zinc organic metal salts. In one embodiment, the ionic crosslinker is a calcium salt (such as Licomont® CaV 102).

In one embodiment, the ionic crosslinker is aluminum acetylacetonate. In further embodiments, the ionic crosslinker is selected from the group consisting of aluminum acetylacetonate, iron acetylacetonate, zinc acetylacetonate, titanium acetylacetonate and zirconium acetylacetonate, and mixtures thereof. In one embodiment, the crosslinker is an aluminum salt of acetic acid. For example, the crosslinker may be an aluminum triacetate ($Al(C_2H_3O_2)_3$), aluminium diacetate, ($HO(Al(C_2H_3O_2)_3)$), or aluminium monoacetate, $((HO)_2(Al(C_2H_3O_2)_3))$. In another embodiment, the crosslinker is tetra(2-ethylhexyl)titanate.

In certain embodiments, the chemical crosslinking involves covalent crosslinking (or a covalent crosslinker). Non-limiting examples of covalent crosslinkers include primary, secondary, or tertiary amines, epoxies, hydroxyl-terminated butadienes, polymeric di-isocynates, and mixtures thereof.

In other embodiments, the covalent crosslinker is an amine crosslinker. In further embodiments, the amine crosslinker is selected from the group consisting of an organic amine, an organic diamine, and an organic polyamine. In other embodiments, the amine crosslinker is selected from the group consisting of ethylene diamine; 1,2- and 1,3-propylene diamine; 1,4-diaminobutane; 2,2-dimethylpropane diamine-(1,3); 1,6-diaminohexane; 2,5-dimethylhexane diamine-(2,5); 2,2,4-trimethylhexane diamine-(1,6); 1,8-diaminooctane; 1,10-diaminodecane; 1,11-undecane diamine; 1,12-dodecane diamine; 1-methyl-4-(aminoisopropyl)-cyclohexylamine-1; 3-aminomethyl-3,5,5-trimethyl-cyclohexylamine-(1); 1,2-bis-(aminomethyl)-cyclobutane; p-xylylene diamine; 1,2- and 1,4-diaminocyclohexane; 1,2-; 1,4-; 1,5- and 1,8-diaminodecalin; 1-methyl-4-aminoisopropyl-cyclohexylamine-1; 4,4'-diamino-dicyclohexyl; 4,4'-diamino-dicyclohexyl methane; 2,2'-(bis-4-amino-cyclohexyl)-propane; 3,3'-dimethyl-4,4'-diamino-dicyclohexyl methane; 1,2-bis-(4-aminocyclohexyl)-ethane; 3,3',5,5'-tetramethyl-bis-(4-aminocyclohexyl)-methane and -propane; 1,4-bis-(2-aminoethyl)-benzene; benzidine; 4,4'-thiodianiline, dianisidine; 2,4-toluenediamine, diaminoditolylsulfone; 2,6-diaminopyridine; 4-methoxy-6-methyl-m-phenylenediamine; diaminodiphenyl ether; 4,4'-bis(o-toluidine); o-phenylenediamine; o-phenylenediamine, methylenebis(o-chloroaniline); bis(3,4-diaminiophenyl)sulfone; diaminiodiphenylsulfone; 4-chloro-o-phenylenediamine; m-aminobenzylamine; m-phenylenediamine; 4,4'-C1-C6-dianiline such as 4,4'-methylenedianiline; aniline-formaldehyde resin; and trimethylene glycol di-p-aminobenzoate and mixtures thereof.

In further embodiments, the amine crosslinker is selected from the group consisting of bis-(2-aminoethyl)-amine, bis-(3-aminopropyl)-amine, bis-(4-aminobutyl)-amine and bis-(6-aminohexyl)-amine, and isomeric mixtures of dipropylene triamine and dibutylene triamine. In yet further embodiments, the amine crosslinker is selected from the group consisting of hexamethylene diamine, tetramethylene diamine, and dodecane diamine and mixtures thereof.

In other embodiments, the covalent crosslinker is a polyol crosslinker. In further embodiments, the polyol crosslinker is selected from the group consisting of polyether-polyols, polyester-polyols, branched derivatives of polyether-polyols (derived from, e.g., glycerine, sorbitol, xylitol, mannitol, glucosides, 1,3,5-trihydroxybenzene), branched derivatives of polyether-polyols (derived from, e.g., glycerine, sorbitol, xylitol, mannitol, glucosides, 1,3,5-trihydroxybenzene), orthophthalate-based polyols, ethylene glycol-based polyols, diethylene glycol-based aromatic and aliphatic polyester-polyols. In further embodiments, the polyol crosslinker is selected from the group consisting of 1,2-propanediol, 1,3-propanediol, diethanolamine, triethanolamine, N,N,N',N'-[tetrakis(2-hydroxyethyl)ethylene diamine], N,N,-diethanolaniline. In other embodiments, the polyol crosslinker is selected from the group consisting of polycaprolactone diol, poly(propylene glycol), poly(ethylene glycol), poly(tetramethylene glycol), and polybutadiene diol and their derivatives or copolymers.

Additives

In certain embodiments, the thermoplastic gel composition may comprise additional components. For example, the gel composition may include additives such as flame retardants, coloring agents, adhesion promoters, antioxidants, stabilizers, fillers, dispersants, flow improvers, plasticizers, slip agents, toughening agents, and combinations thereof.

In certain embodiments, the gel composition comprises an antioxidant or stabilizer such as a hindered phenol (e.g., Irganox™ 1076, commercially available from Ciba-Geigy Corp., Tarrytown, N.Y.), phosphites (e.g., Irgafos™ 168, commercially available from Ciba-Geigy Corp.), metal deactivators (e.g., Irganox™ D1024, commercially available from Ciba-Geigy Corp.), and sulfides (e.g., Cyanox LTDP, commercially available from American Cyanamid Co., Wayne, N.J.), light stabilizers (e.g., Cyasorb UV-531, commercially available from American Cyanamid Co.), and/or phosphorous containing organic compounds (e.g., Fyrol PCF and Phosflex 390, both commercially available from Akzo Nobel Chemicals Inc. of Dobbs Ferry, N.Y.) and acid scavengers (e.g., DHT-4A, commercially available from Kyowa Chemical Industry Co. Ltd through Mitsui & Co. of Cleveland, Ohio, and hydrotalcite). Other suitable additives include colorants, biocides, tackifiers and the like described in "Additives for Plastics, Edition 1" published by D.A.T.A., Inc. and The International Plastics Selector, Inc., San Diego, Calif.

In certain embodiments, the gel composition comprises a toughening agent that may improve the ability for the composition to deform without breaking. In some embodiments, the toughening agent may allow the composition to be strained to approximately 800%, 1000%, or 1200% of its original size before breaking.

In certain embodiments, the toughening agent is a fumed silica. In certain embodiments, the fumed silica comprises between 0.1-30 wt % of the overall composition, 1-25 wt % of the overall composition, or 5-20 wt % of the overall composition. One non-limiting example of a fumed silica that may be used in the gel composition is AEROSIL® R9200 modified, hydrophobic fumed silica, available from Evonik Degussa Corp. (Parsippany, N.J., USA).

In certain embodiments, the additional additives may include at least one material selected from the group consisting of Dynasylan 40, PDM 1922, Songnox 1024, Kingnox 76, DHT-4A, Kingsorb, pigment, and mixtures thereof. In some embodiments, the additives comprise between 0.1 and 25 wt % of the overall composition, between 0.1 and 5 wt % of the overall composition, between 0.1 and 2 wt % of the overall composition, or between 0.1 and 1 wt % of the overall composition.

In some embodiments, the compositions disclosed and by methods disclosed herein comprise a flame retardant. In certain embodiments, the flame retardant is zinc oxide. In other embodiments, the flame retardant is a halogenated paraffin (e.g., Bromoklor 50, commercially available from Ferro Corp., Hammond, Ind.). In some embodiments, the flame retardant comprises between 0.1 and 25 wt % of the overall composition, between 0.1 and 5 wt % of the overall composition, between 0.1 and 2 wt % of the overall composition, or between 0.1 and 1 wt % of the overall composition. In one embodiment, the flame retardant comprises 20 wt % of the overall gel composition.

In some embodiments, the compositions disclosed and made by methods disclosed herein contain at least one stabilizer. Stabilizers include antioxidants, acid-scavengers, light and UV absorbers/stabilizers, heat stabilizers, metal deactivators, free radical scavengers, carbon black, and antifungal agents.

Uses and Properties of the Hybrid Thermoplastic Gel, and Testing Methods

The gels described herein may be used in a number of end uses due to their improved properties, such as improved behavior in mechanical stresses (e.g., vibration and shock) or ability to seal uneven or complicated structures (due to the ability to flow and adapt to the area of the structure). In certain embodiments, the gel may be used in an interconnect, cover, or closure system. In particular, the gel may be used in a fiber optic closure, electrical sealant, or electrical closure. In some embodiments, the gels are used as gel wraps, clamshells, or gel caps. In further embodiments, the gels are used in the inside of a residence. In other embodiments, the gels are used outside of a residence. Use of the gel within a closure or interconnect system may allow for a reduction in the number of components, frame size, or cost over other sealing mechanisms.

With regards to use as a sealant, the hybrid gels described herein tend to exhibit a unique stress-strain dynamic, as further described below. With an increase in strain beyond the point of the elastic (linear) portion of the curve, the gel exhibits a somewhat exponential increase in stress prior to the failure point. In other words, the gel tends to become even stiffer with an increase in strain or pressure on the gel as it approaches its failure point. In certain examples, such as within a closure, the gel is stiff at the higher strain points near the ends of the closure, keeping the softer gel composition within the closure from extruding out of the closure.

In certain embodiments, the gel is used as a dampener. In certain embodiments, the gel is used as a flame retardant sealant. In one embodiment, the gel comprises a flame retardant additive (e.g., zinc oxide) in order to function as a flame retardant sealant.

In certain embodiments, the gel is used in a closure or enclosure system. In certain embodiments, the closure system comprises a housing, a cable, and a gel. In some embodiments, the cable is a LSZH cable.

In some embodiment, the system further comprises a connector, and, in some instances, a receptacle or port, therein forming an interconnect system. The interconnect system may comprise a mini input/output connector, data connector, power connector, fiber optic connector, or combination thereof. For example, the interconnect system may comprise a RJ-45 connector system. Non-limiting examples of interconnect systems and components are displayed in FIGS. 1, 2, 3, 4a, 4b, 5a, and 5b.

The gel may be used to create a seal formed by displacement. In other embodiments, the gel may be used to create a seal having radial functionality, axial functionality, or a combination thereof. In yet other embodiments, the gel may be used to create a seal formed by displacement and having radial and/or axial functionality.

Figure 2:
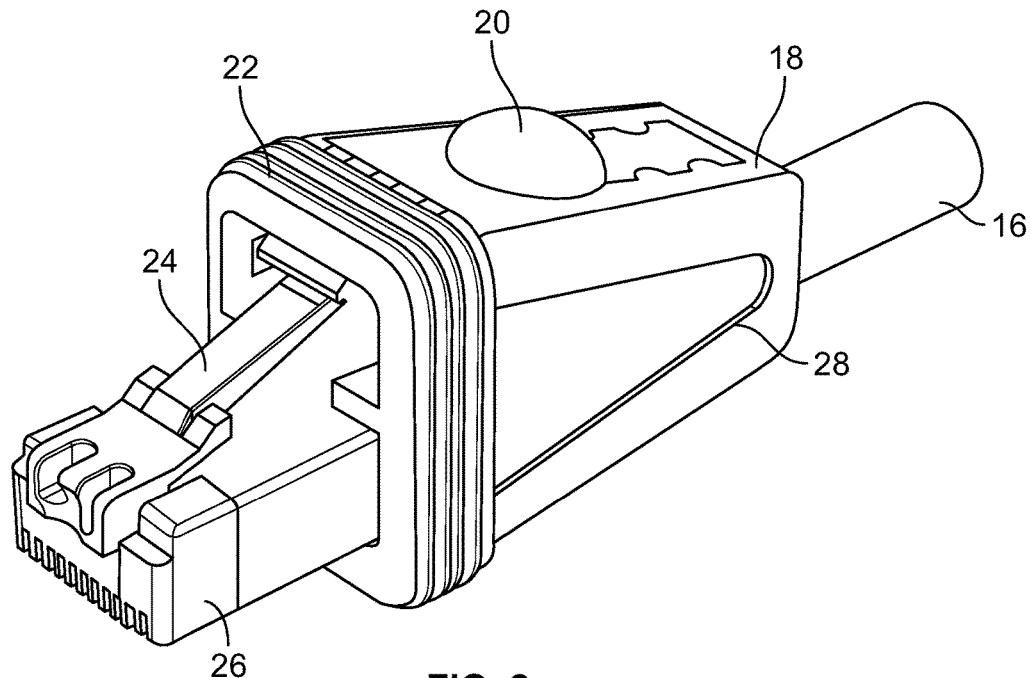
FIG. 2 is a depiction of a connector, housing, and cable assembly with radial sealing.
Figure 3:
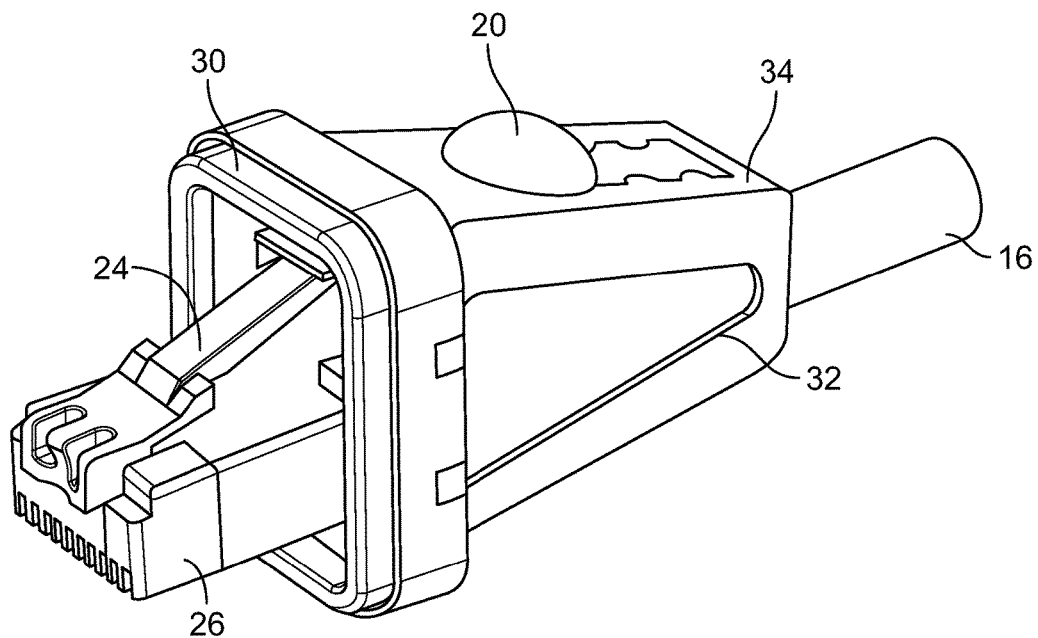
FIG. 3 is a depiction of a connector, housing, and cable assembly with axial sealing.

FIGS. 1, 2, and 3 provide non-limiting examples of radial and axial functionality. FIG. 1 displays an example of a connection hub having multiple connection receptacles or ports for the cables 16 within the housings 14 to be connected. FIG. 1 displays both radial connection ports 10 and axial connection ports 12. FIG. 2 displays a connector 26; housing 18, 28; and cable 16 assembly with radial sealing 22. FIG. 3 displays a connector 26; housing 32, 34; and cable 16 assembly with axial sealing 30, wherein the seal follows the surface of the axial port 12 (as shown in FIG. 1). In certain embodiments, the housing may have a knob 20 that may be pushed inward to engage the latch 24 on the connector 26, allowing the connector to be removed from the port.

Figure 4A:
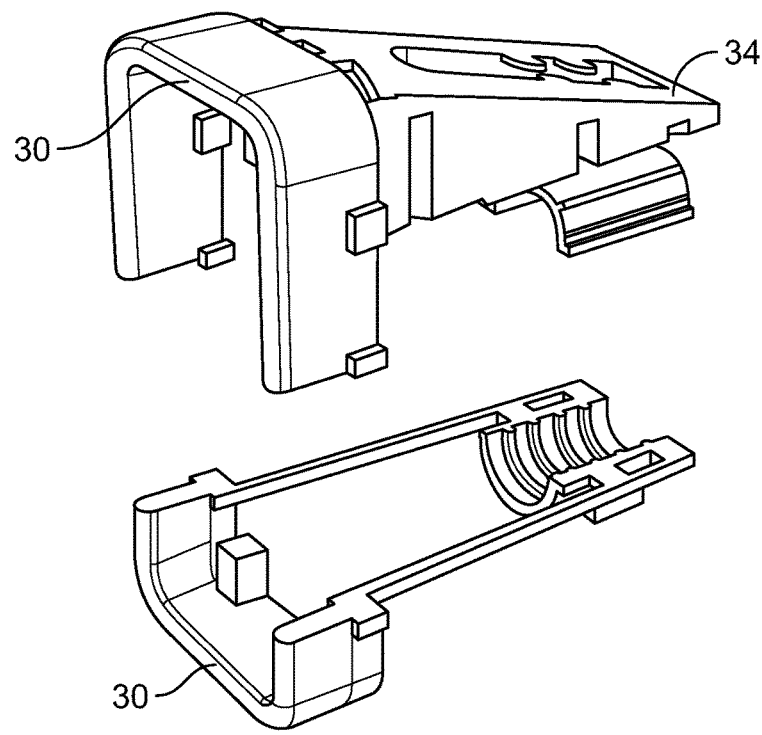
FIGS. 4a and 4b are depictions of a straight two piece housing assembly designed for axial sealing.
Figure 4B:
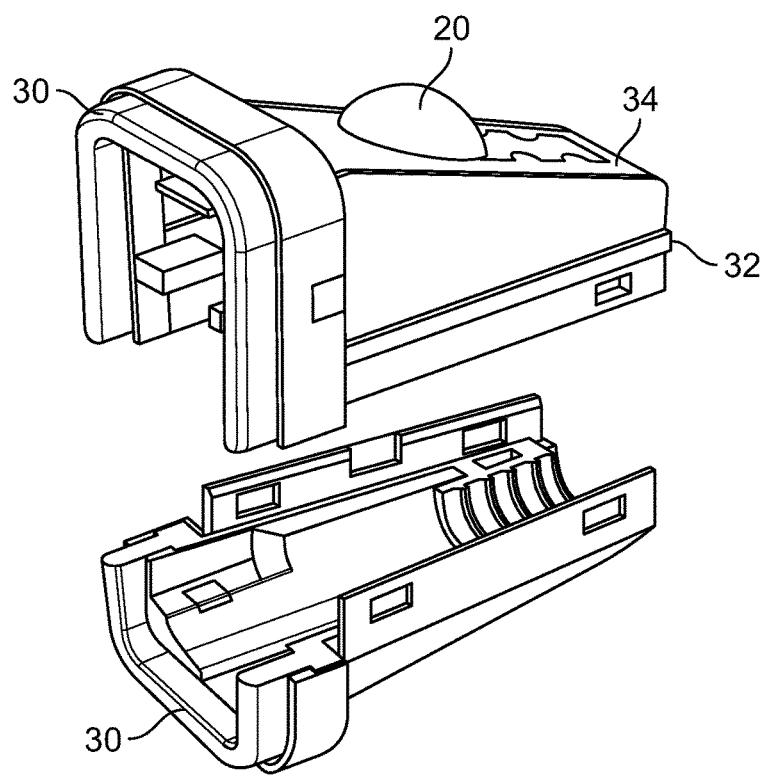

In certain embodiments, the gel may be used to create a seal in a housing assembly having multiple parts. For example, in one embodiment the gel may be used in a straight two-piece housing assembly, as shown in FIGS. 4a and 4b. Similar to FIG. 3, FIGS. 4a and 4b display a two-piece housing 32, 34, having axial sealing 30, wherein the seal follows the surface of the axial port 12 (as shown in FIG. 1). In certain embodiments, the housing may have a knob 20 that may be pushed inward to engage the latch 24 (as shown in FIG. 3) on the connector 26 (as shown in FIG. 3), allowing the connector to be removed from the port.

Figure 5A:
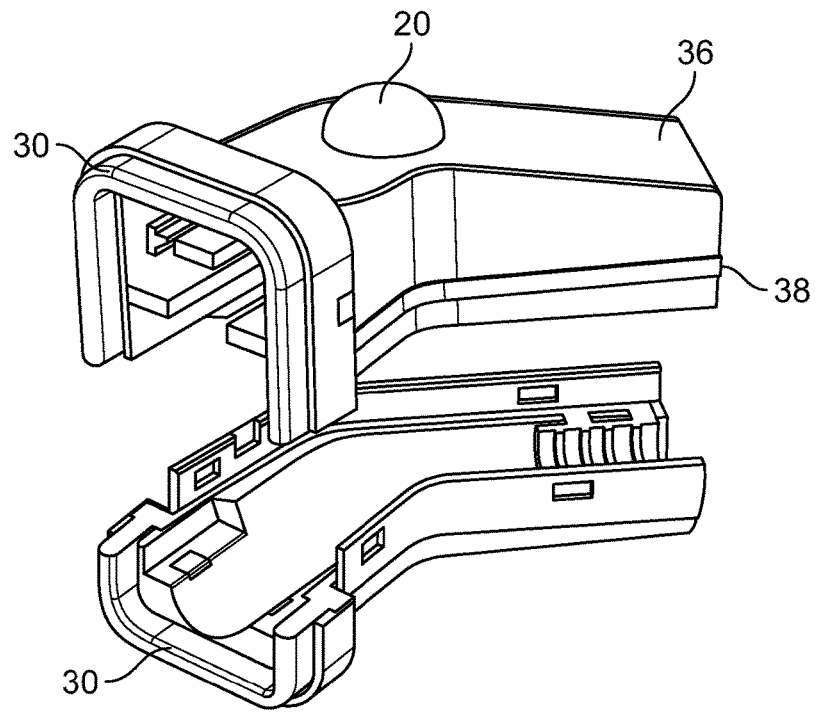
FIGS. 5a and 5b are depictions of an angled two piece housing assembly designed for axial sealing.
Figure 5B:
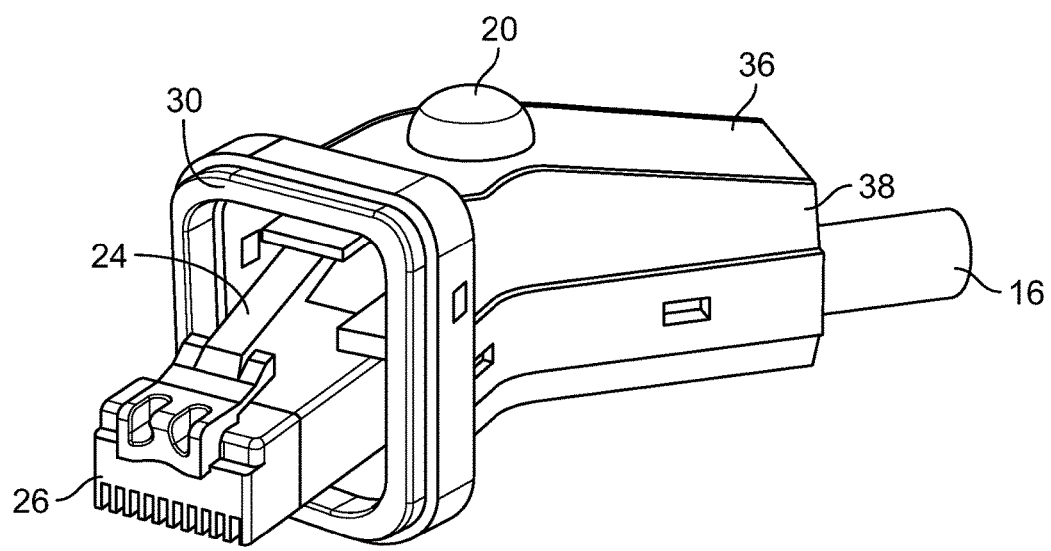

In another embodiment, the gel may be used in an angled two-piece housing assembly, as shown in FIGS. 5a and 5b. FIGS. 5a and 5b display a connector 26; angled two-piece housing 36, 38; and cable 16 assembly with axial sealing 30, wherein the seal follows the surface of the axial port 12 (as shown in FIG. 1). In certain embodiments, the housing may have a knob 20 that may be pushed inward to engage the latch 24 on the connector 26, allowing the connector to be removed from the port.

The gel may be sealed around the cable 16 by sliding a smaller diameter gel formation over the cable to create a seal through interference. In other embodiments, the seal may be created by molding the gel around the inside of the housing components and then snapping the housing, gel, and cable into place.

In some embodiments, the gel is used in a closure or interconnect system that is "compatible" with a low smoke zero halogen (LSZH) cable. In certain embodiments, compatibility is measured by subjecting the sample to one or more mechanical or environmental tests to test for certain functional requirements. In some embodiments, compatibility is measured by passing a pressure loss test, tightness test, and/or visual appearance test. In certain embodiments, the gel in the closure or interconnect system is compatible where a traditional thermoplastic elastomer gel would fail.

In certain embodiments, the gel is used as a sealant in a telecommunications enclosure. Non-limiting examples of telecommunications enclosures are shown in FIGS. 6-10.

Figure 6:
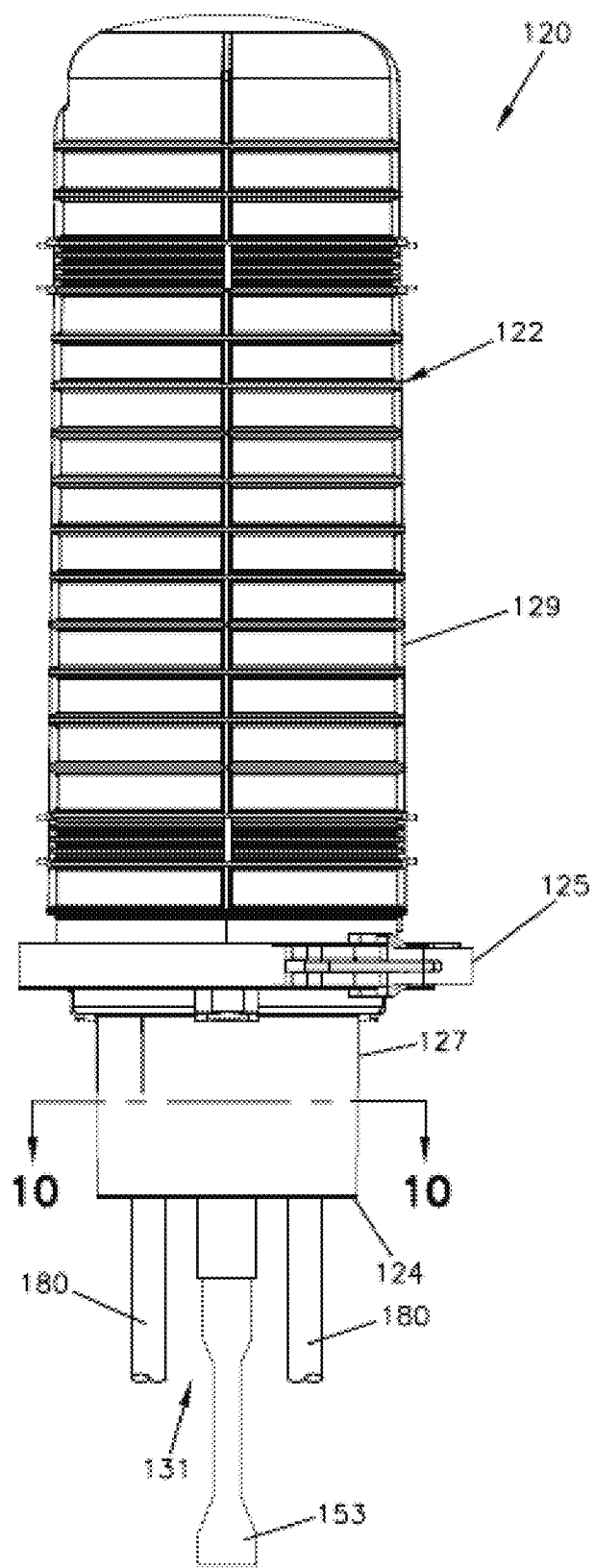
FIG. 6 is a side view of a telecommunications enclosure suitable for using a sealant in accordance with the principles of the present disclosure.
Figure 7:
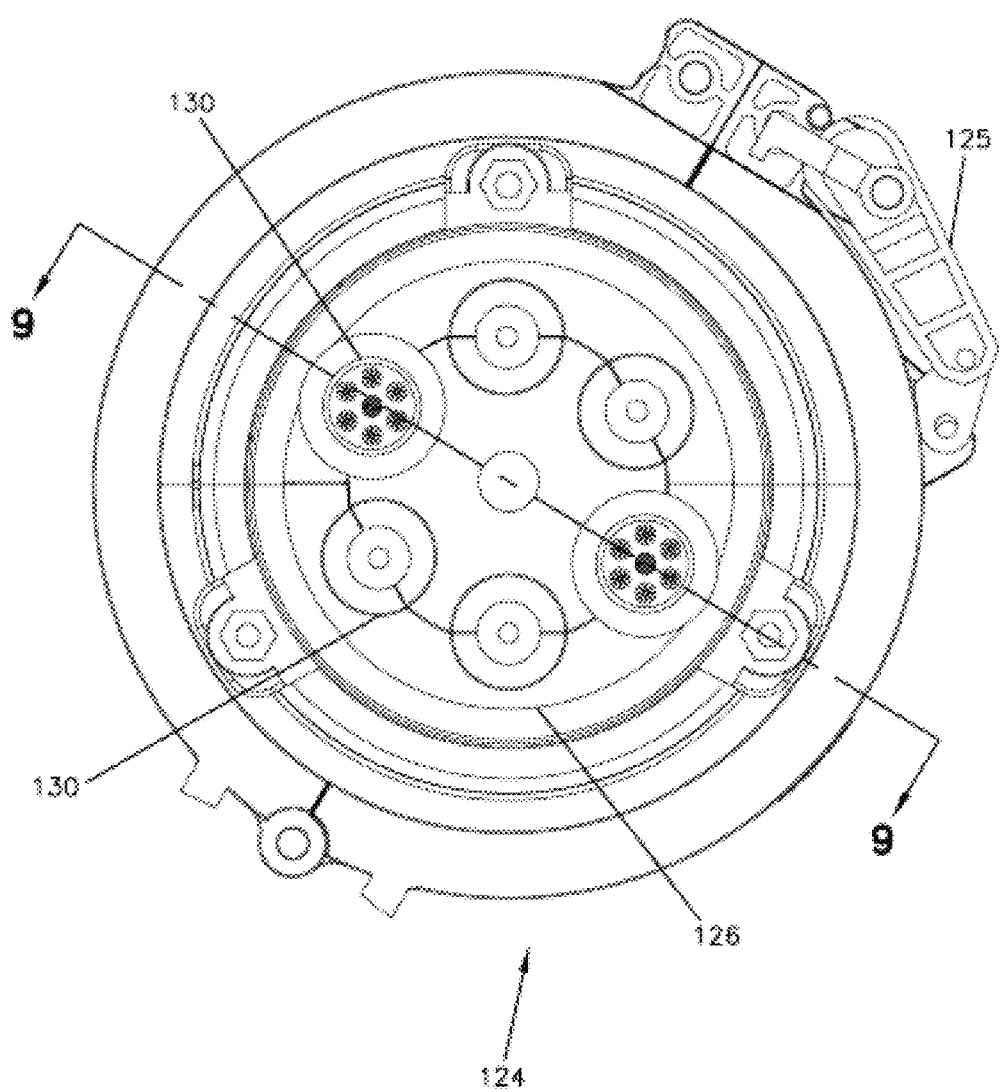
FIG. 7 is an end view of the telecommunications enclosure of FIG. 6.
Figure 8:
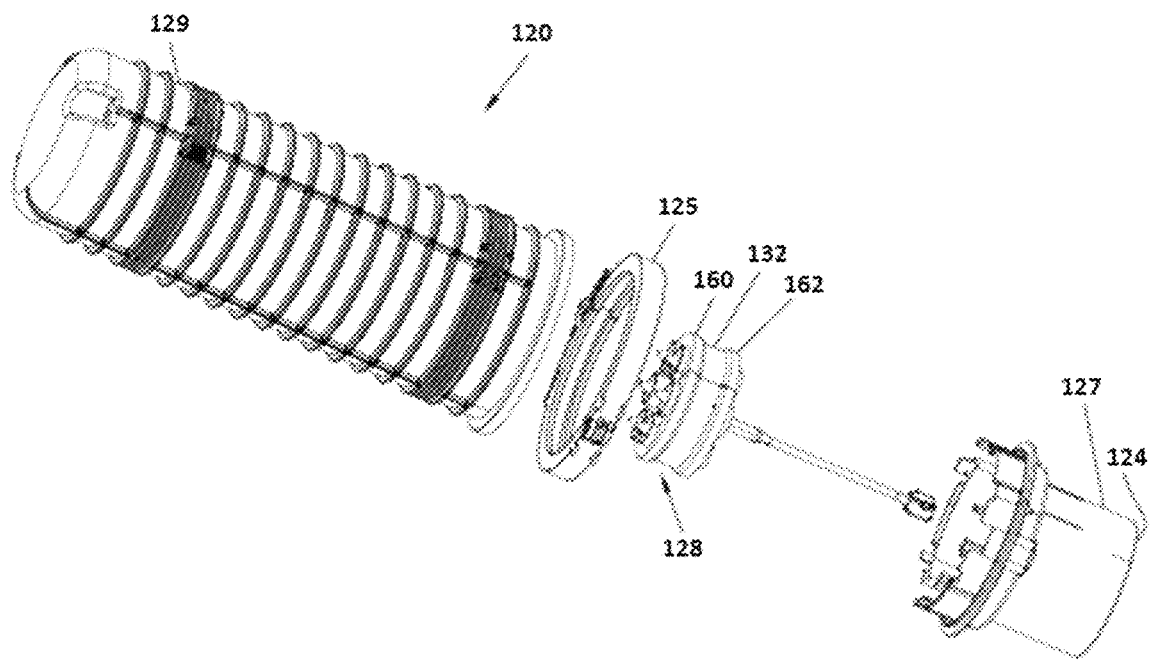
FIG. 8 is an exploded view of the telecommunications enclosure of FIG. 6.

FIGS. 6-8 show a telecommunications enclosure 120 suitable for using a sealing material in accordance with the principles of the present disclosure. The enclosure 120 includes a housing 122 having an end 124 defining a sealing unit opening 126. The sealing unit opening 126 is defined by a base 127 of the enclosure 120. The base 127 has a hollow sleeve-like configuration. A dome-style cover 129 is secured to the base 127 by a channel clamp 125. The enclosure 120 also includes a sealing unit 128 (see FIGS. 8-10) that fits within the sealing unit opening 126. The sealing unit 128 includes a sealant arrangement 132 (see FIGS. 9 and 10) defining a plurality of cable ports 130. The sealant arrangement can include a material having stress-strain characteristics in accordance with the principles of the present disclosure. In certain embodiments, the sealant arrangement can include a hybrid gel of the type disclosed herein. When pressurized, the sealant arrangement 132 is configured for providing seals about structures (e.g., cables, plugs, etc.) routed though the cable ports 130 and is also configured for providing a peripheral seal with the housing 122. The enclosure 120 further includes an actuation arrangement 131 (see FIG. 9) for pressurizing the sealant arrangement 132 within the sealing unit opening 126. In other embodiments, the housing can be an enclosure (e.g., an aerial enclosure) having a pass-through configuration with sealing units located at opposite ends of the enclosure. In certain embodiments, a frame supporting optical components (e.g., optical splices, optical splitters, optical splice trays, optical splitter trays, fiber management trays, passive optical splitters, wavelength division multi-plexers, etc.) can be mounted within the enclosure 120.

Figure 9:
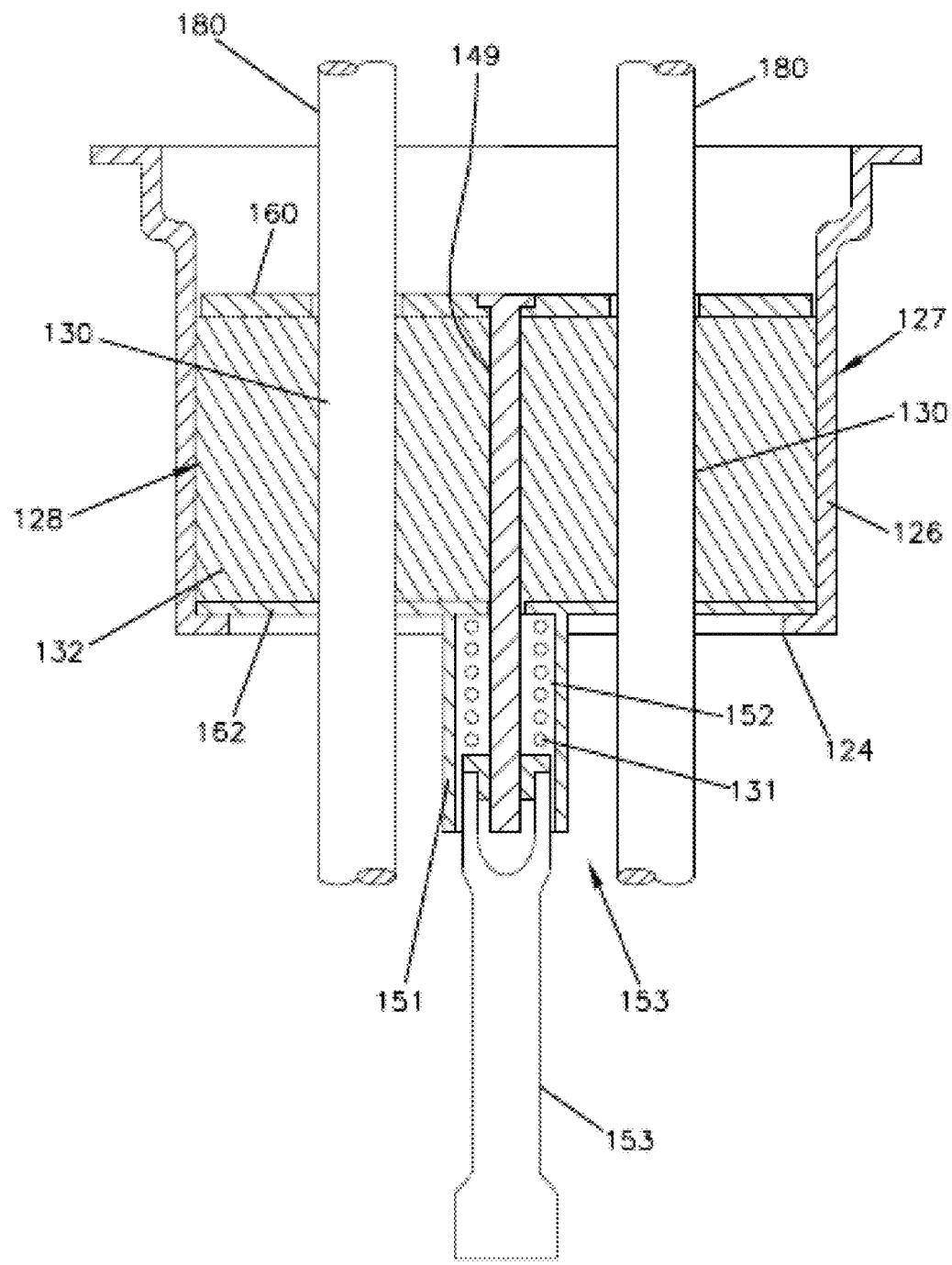
FIG. 9 is a cross-sectional view taken along section line 9-9 of FIG. 7.

Referring to FIG. 9, the actuation arrangement 131 includes inner and outer pressurization structures 160, 162 (e.g., plates, members, bodies, etc.). The sealant arrangement 132 is positioned between the inner and outer pressurization structures 160, 162. The actuation arrangement 131 also includes a threaded shaft 149 that extends between the inner and outer pressurization structures 160, 162 and a nut 151 that is threaded on the threaded shaft 149. The actuation arrangement further includes a spring 152 for transferring a seal pressurization force to the sealant arrangement 132. The spring 152 is captured between the nut 151 and the outer pressurization structure 162. An extension 153 (e.g., a wrench or other tool) is used to turn the nut 151 a first rotational direction (e.g., clockwise) on the threaded shaft 149 causing the spring 152 to be compressed between the nut 151 and the outer pressurization structure. As the spring 152 is compressed, the threaded shaft 149 is tensioned and the inner and outer pressurization structures 160, 162 are drawn together. As the inner and outer pressurizations structures 160, 162 are drawn together, the sealant arrangement 132 is pressurized between the pressurization structures 160, 162 causing the sealant arrangement 132 to flow/deform to fill voids within the sealing unit opening 126, to form the peripheral seal with the housing 122, and to form seals around any cables or inserts positioned within cable ports 130. Thus, when the actuation arrangement 131 is actuated, the first and second pressurization plates 60, 62 are spring biased toward one another such that spring pressure is applied through the sealant arrangement 132 for pressurizing the sealant arrangement 132 to maintain effective sealing over an extended period of time. In other embodiments, different actuation configurations can be used. The sealant arrangement 132 can be de-pressurized by turning the nut 151 a second rotational direction (e.g., counterclockwise) on the shaft 149 to decompress the spring 152.

Figure 10:
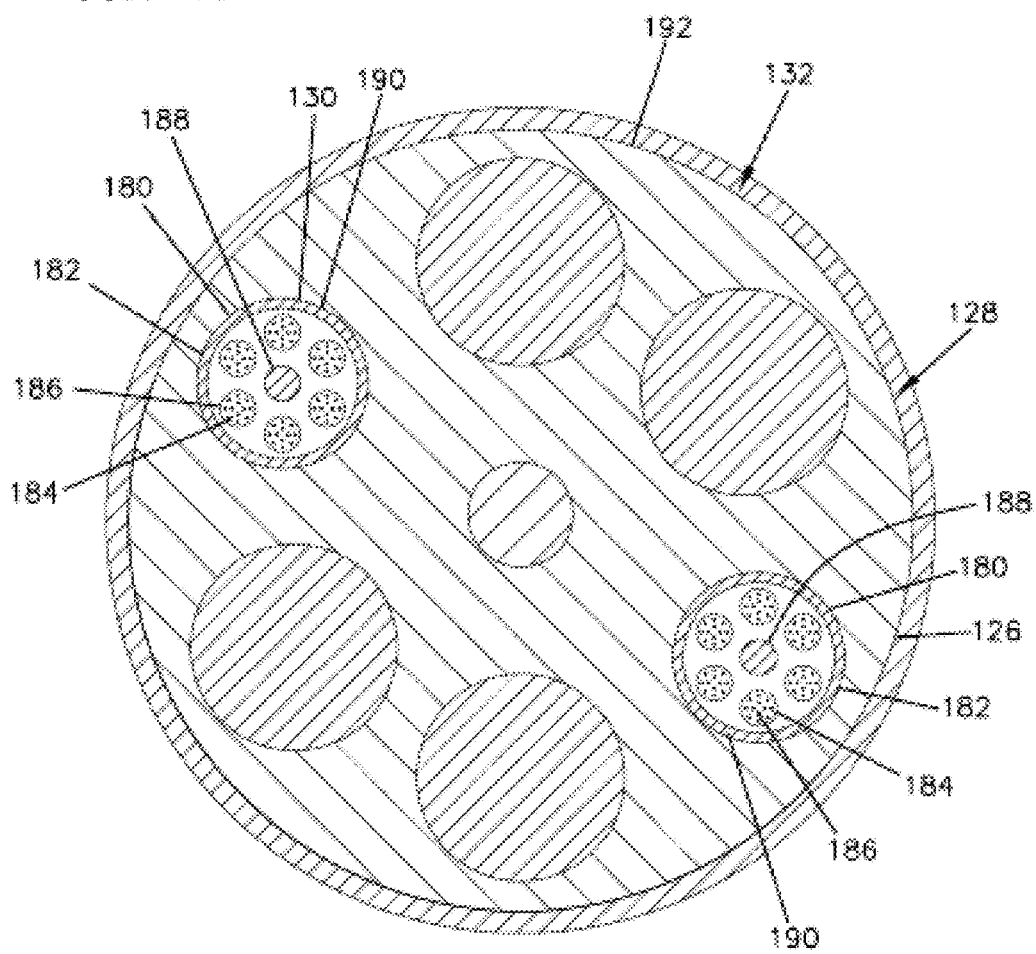
FIG. 10 is a cross-sectional view taken along section line 10-10 of FIG. 6.

Referring to FIGS. 9 and 10, two cables 180 are shown passing through the cable ports 130 while the remainder of the cable ports 130 are shown blocked with plugs. The cables 180 include outer jackets 182 containing a plurality of buffer tubes 184. A plurality of optical fibers 186 are contained in each of the buffer tubes 184. The cables 180 also include center strength members 188 (e.g., fiberglass reinforced epoxy rods) that provide the cables with tensile and compressive reinforcement. In other embodiments, reinforcing members in the form aramid yarns or other reinforcing structures can be used. In certain embodiments, the cables 180 can be LSZH cables and the outer jackets include EVA. When pressurized, the sealant arrangement 132 contacts the outer jackets 182 and forms cable seals 190 around peripheries of the cable jackets 182. When pressurized, the sealant arrangement 132 also contacts an interior of the base 127 to form a peripheral seal 192 with the base 127. Cables having alternative constructions (e.g., flat drop cables, cables without buffer tubes, cables without center strength members, etc.) can also be used.

The sealant of the sealant arrangement 132 can be designed with custom stress-strain profile suitable for a given application. In certain embodiments, the stress-strain profile includes a first stress-strain slope corresponding to an initial elongation range and a second stress-strain slope corresponding to a subsequent elongation range. In certain embodiments, a transition area or slope exists between the first stress-strain slope and the second stress-strain slope.

In certain embodiments, the initial elongation range is from 0 to at least 200 percent elongation, or from 0 to at least 400 percent elongation, or from 0 to at least 600 percent elongation. In other embodiments, the initial elongation range exists at less than 600 percent elongation, or at less than 400 percent elongation, or at less than 200 percent elongation. The subsequent elongation range preferably starts at or after the end of the initial elongation range. The second stress-strain slope preferably is steeper than the first stress strain slope. In certain embodiments, the second stress-strain slope is at least 10 percent steeper than the first stress-strain slope (i.e., the second stress-strain slope is at least 1.1 times as steep as the first stress-strain slope). In other embodiments, the second stress-strain slope is at least 25 percent steeper than the first stress-strain slope (i.e., the second stress-strain slope is at least 1.25 times as steep as the first stress-strain slope). In still other embodiments, the second stress-strain slope is at least 50 percent steeper than the first stress-strain slope (i.e., the second stress-strain slope is at least 1.5 times as steep as the first stress-strain slope). In additional embodiments, the second stress-strain slope is at least 100 percent steeper than the first stress-strain slope (i.e., the second stress-strain slope is at least 2 times as steep as the first stress-strain slope). The first stress-strain slope can be suitable for allowing the sealant arrangement to deform and flow to effectively fill voids within the opening 126 of the base 127. The second stress-strain slope profile can be suitable for inhibiting the sealant arrangement 132 from escaping containment between the inner and outer pressurization structures 160, 162 when fully pressurized.

The stress-strain properties of the gel may be tested by forming a round ring sample cut from a 3 mm thick sheet of gel using a defect free steel die set. The inside diameter of the ring is approximately 18 mm and the outside diameter is 27 mm. Mechanical property tests are performed using a universal test machine (Instron type) at a strain rate of 500 mm/min. The ring is placed in the test machine by slipping it over cylindrical pins 7 mm in diameter separated by a distance of 33 mm. One of the cylindrical pins is held in a stationary fixture while the other pin is held in a fixture attached to a load cell. The sample is oriented between the two pins such that it is directly under the load cell and is subject solely to a uniaxial tensile force (i.e., no side loading). The ring sample is then pulled at 500 mm/min until failure.

Tightness may be tested under International Electrotechnical Commission (IEC) Test 61300-2-38, Method A and TEC 60068-2-17, Test Qc. In certain embodiments, tightness is tested by immersing the specimen in a water bath and using an internal pressure of 20–40 kPa (0.2-0.4 atm) for 15 minutes. It is important that tightness is measured directly after installing the closure at a temperature of −15° C. or 45° C. It is also important that all the air bubbles present on the outside of the closure are removed. If a continuous stream of air bubbles is observed, this means the specimen is not properly sealed and it will be considered as a failure (i.e., not compatible).

Pressure loss may be tested under IEC 61300-2-38, Method B. In certain embodiments, the gel and cable are compatible if the difference in pressure before and after the test is less than 2 kPa (0.02 atm).

Visual appearance may be tested under IEC 61330-3-1 by examination of the product with the naked eye for defects that could adversely affect the product performance.

The sample may be subjected to various mechanical and/or environmental conditions prior to testing tightness, pressure loss, visual appearance, etc. In certain embodiments, compatibility is determined by subjecting the sample to one or more of the following mechanical tests: axial tension test, flexure test, re-entry test, and torsion test, and/or one or more environmental tests: resistance to aggressive media test, resistance to stress cracking test, salt fog test, temperature cycling test, and waterhead test.

In certain embodiments, the sample is subjected to an axial tension test according to IEC 61300-2-4. In this test, the sample may be pressured internally at 20 kPa (0.2 atm) or 40 kPa (0.4 atm) at room temperature and sealed. The base assembly is clamped and a force is applied to each of the extending cables individually. If the sample has an outer diameter of less than or equal to 7 mm, then the amount of force per cable applied is equal to (outer diameter/45 mm)*500 Newtons ("N"). This force is applied for 15 minutes for each cable and built up to the IEC 61300-2-4 test. If the sample has an outer diameter of greater than 7 mm, then the amount of force per cable applied is equal to (outer diameter/45 mm)*1000 N, with a maximum of 1000 N applied. This force is applied for one hour. Internal pressure is then examined for pressure loss. In certain embodiments, the gel and cable are compatible if the pressure loss is less than 2 kPa (0.02 atm). In addition, in certain embodiments, the gel and cable are compatible if the displacement of the cable is less than 3 mm. In other embodiments, the specimens are further subjected to the tightness test, previously described.

In other embodiments, compatibility is measured by subjecting the sample to a flexure test according to IEC 61300-2-37. In this test, the samples are subjected to temperatures of −15° C. and 45° C. Samples are pressured internally at 20 kPa or 40 kPa (0.2 atm or 0.4 atm) and sealed. Cables are bent individually at an angle of 30° (or a maximum force application of 500 N) each side of neutral in the same plane. Each bending operation is held for 5 minutes. The cable is returned to its original position and then the procedure is repeated in the opposite direction. After 5 cycles on each cable, the samples are visually inspected by the naked eye for appearance, conditioned at room temperature, and subjected to a tightness test. In some embodiments, the gel and LSZH cable are compatible if the specimen passes the visual appearance test, pressure loss test (i.e., less than 2 kPa (0.02 atm)), and/or tightness test.

In another embodiment, compatibility is measured by subjecting the sample to a re-entry test according to IEC 61300-2-33. In certain embodiments, re-entry can be simulated after a certain time of temperature cycling. To complete this test, the closure has to be removed from the cycling room and tested on tightness. After this a reentry test can be done. In this test, a dummy plug or cable is removed from the closure and another cable or dummy plug is added. Then, tightness is measured again. Re-entry is successful if the closure passes the tightness test again.

Another mechanical test may be employed to determine compatibility. The sample may be subjected to a torsion test according to IEC 61300-2-5. After completion of the torsion test, the gel and cable may be considered compatible if the sample passes the visual inspection test, pressure loss test, and/or tightness test.

In yet other embodiments, compatibility is measured by conducting an environmental test of temperature cycling or accelerated aging under TEC 61300-2-22 and TEC 60068-2-14, Test Nb. In one embodiment, the temperature cycling test is conducted on the cable jacket between the gel blocks by cycling the temperature between −40° C. and 70° C. for 10 days at two cycles between the extreme temperatures per day. In some embodiments, the humidity is uncontrolled, the dwell time is four hours and the transition time is two hours. In certain embodiments, the cable jacket is tested for maintenance of tensile strength, ultimate elongation, tightness, visual appearance, and/or re-entry. Also, in certain embodiments, after the temperature cycling test, tightness of the closures needs to be tested after being conditioned to room temperature for a minimum of 2 hours. Therefore, in certain embodiments, the gel and LSZH cable are compatible if the specimen passes the tightness test.

In another embodiment, compatibility is determined by subjecting the sample to a resistance to aggressive media test under IEC 61300-2-34, ISO 1998/I, and EN 590. The sample is considered compatible if it subsequently passes the tightness and/or appearance test.

In yet another embodiment, compatibility is determined by subjecting the sample to a resistance to stress cracking test under IEC 61300-2-34. The sample is considered compatible if it subsequently passes the tightness test and/or shows no visible signs of cracking.

In other embodiments, compatibility is determined by subjecting the sample to a salt fog test under IEC 61300-2-36 and IEC 60068-2-11, Test Ka. The sample is considered compatible if it subsequently passes the tightness and/or appearance test.

In some embodiments, compatibility is determined by subjecting the sample to a waterhead test under IEC 61300-2-23, Method 2. The sample is considered compatible if there is no water ingress.

In certain embodiments, the gel has measurable properties. For example, in some embodiments, the gel has a hardness in the range of 24 to 53 Shore 000 Hardness, or 80 to 300 g, as measured according to methods known in the art. In certain embodiments, the shore hardness gauge is measured according to ISO868 or ASTM D2240. In other embodiments, hardness can be measured on a texture analyzer. For example, a LFRA Texture Analyzer-Brookfield may include a probe assembly fixed to a motor driven, bi-directional load cell. In such a system, the probe is driven vertically into the sample at a pre-set speed and to a pre-set depth. The hardness is the amount of force needed to push the probe into the test sample. In other embodiments, the gel has a hardness in the range of 37 to 45 Shore 000, or 160 to 220 g. In yet other embodiments, the gel has a hardness in the range of 38 to 42 Shore 000, or 170 to 200 g.

For further example, the gel may have certain properties after being subjected to compression set testing. A modified version of ASTM D395, method B provides one method of compression set testing to determine the ability of elastomeric materials to maintain elastic properties after prolonged compressive stress. The test measures the somewhat permanent deformation of the specimen after it has been exposed to compressive stress for a set time period. Under compression testing, the thickness of the original specimen is measured and then the specimen is then placed between spacers and in a compression device. The specimen may be compressed to 25% or 50% of its original height, using spacers to accurately measure the compression. Within two hours of assembly, the compression device is placed in an oven at a specified temperature for an extended periods of time. After removing the sample from the oven, the specimen is allowed to cool (e.g., for 30 minutes) before measuring the final thickness. In certain embodiment, the compression set of the gel sample, as measured after 50% strain has been applied for 1000 hours at 70° C., has a range between 4% and 20%. In other embodiments, the compression set, as measured after 50% strain has been applied for 1000 hours at 70° C., has a range between 10% and 14% when measured according to the modified version of ASTM D395, method B described above.

In some embodiments, the gel is compressed with a certain strain or deformation (e.g., in certain embodiments, to 50% of its original size). This causes a certain stress in the material. The stress is now reduced because the material relaxes. In certain embodiments, the stress relaxation of the gel has a possible range between 20 and 65% when subjected to a tensile strain or deformation of about 50% of the gel's original size, wherein the stress relaxation is measured after a one minute hold time at 50% strain. In other embodiments, the stress relaxation of the gel is between 30% and 50% when subjected to a tensile strain of about 50%. A higher stress relaxation indicates that once a gel is installed in a closure, the gel will require less stress in order for it to seal.

In certain embodiments, the gel composition has less than 10% bleed out over a period of time when the gel is under compression of 50 kPa (0.5 atm) or 120 kPa (1.2 atm) at 60° C. The weight of the gel sample is recorded before and after the pressure has been applied. In certain embodiments, oil bleed out is measured on a wire mesh, wherein the oil loss may exit the gel through the mesh. Typically, gel samples should be 3 mm±0.5 mm thick and have a diameter of 14 mm±0.5 mm, and three samples should be tested from each gel. The gel sample is placed into a cylindrical hole/tube resting on a fine and rough screen, which gives enough support to hold the gel but in the meantime allows the oil to separate from the gel. Pressure is applied to the gel by placing a weight on top of a piston (which prevents the gel from creeping out of the hole. Typically, approximately 50 kPa (0.5 atm) or 120 kPa (1.2 atm) of pressure is placed on the gel sample. Then, the sample is placed in an oven at 60° C. After 24 hours, the sample is removed from the oven to clean the surface oil and weigh the gel. The sample is then returned to the oven. Weight measurements are taken every 24 hours until stabilization has occurred (e.g., when 5 weight measurements are constant).

In some embodiments, the gel has less than 8%, 6%, 4%, or 2% oil bleed out over the period of time. In certain embodiments, the oil loss is measured at 200 hours, 400 hours, 600 hours, 800 hours, 1000 hours, 1200 hours, or 1440 hours (60 days).

In certain embodiments, the gel has less oil bleed out in comparison to a thermoplastic gel over the same period of time at 50 kPa (0.5 atm) or 120 kPa (1.2 atm) at 60° C. In some embodiments, the gel has less than 20%, 30%, 40%, 50%, or 60% of the oil bleed out of a similar, traditional thermoplastic gel at 200 hours, 400 hours, 600 hours, 800 hours, 1000 hours, 1200 hours, 1440 hours (60 days), 2000 hours, or 3000 hours.

EXAMPLES

A variety of gels and extended elastomers were made using modified extenders.

Example 1

A thermoplastic gel was made using the following formula:

| Component | Weight Percent |
|---|---|
| Maleated TPC 595 | 82.5 |
| Kraton MD6684 | 11.0 |
| Kraton G1701M | 4.0 |
| Irganox 1076 | 1.0 |
| Irganox B225 | 0.75 |
| Aluminum acetylacetonate (AlAcAc) | 0.75 |

The components were combined at 200° C. using a multi-shaft high shear mixer until a uniform material was obtained (approximately 3 hours of mixing). The composition of matter is a reduction to practice of several of the key ideas disclosed. Maleated TPC 595 represents one embodiment of a functionalized extender. In addition, the formula contains base polymers—maleated Kraton MD6684 and Kraton G1701M. The AlAcAc functions as a coupling agent or ionic crosslinker. Irganox 1076 and Irganox B225 function as stabilizer compositions.

There are several possibilities for the coupling agent, these include coupling the TPC 595 to itself, coupling the TPC 595 to the MD 6684 and coupling one MD6684 molecule to another. All three possibilities serve to inhibit the bleed out of the extender molecule by making it longer (two or more associated extender molecules), causing it to become associated with the Kraton base polymer, or forming a Kraton network that is more difficult for the extender to squeeze out of. The gel formed in this example was a thermoplastic material and could be melt-processed at 180° C. in a hot press.

Example 2

A thermoplastic gel was made using the following formula:

| Component | Weight Percent |
|---|---|
| Maleated TPC 595 | 75.5 |
| Kraton MD6684 | 15.0 |

-continued

| Component | Weight Percent |
|---|---|
| Kraton G1701M | 5.0 |
| Irganox 1076 | 1.0 |
| Zinc acetylacetonate (ZnAcAc) | 1.0 |
| Aluminum acetylacetonate (AlAcAc) | 2.5 |

This gel was made in a similar manner to the previous example and had many of the same characteristics, including reduced extender bleed out compared with a current gel or elastomer formulation which did not contain the functionalized extender.

Example 3

A thermoplastic gel was made using the following formula:

| Component | Weight Percent |
|---|---|
| Maleated TPC 595 | 79.0 |
| Kraton MD6684 | 6.0 |
| Kraton G1651 | 5.5 |
| Kraton G1701M | 5.0 |
| Irganox 1076 | 1.0 |
| Licomont ® CaV 102 (calcium salt of montanic acid) | 2.5 |

This gel was made in a similar manner to the previous examples and illustrates that a wide variety of reductions to practice are possible using the concepts outlined in the first paragraphs. These concepts include mixing maleated and non maleated Kratons as well as using a variety of organic metal salts to aid in coupling the maleated extender to the polymer molecules. Lithium, sodium, zinc, and other organic metal salts will also function as coupling agents. A variety of functionalized extenders will also work in similar formulations. These include, but are not limited to, acid modified polybutadienes, functionalized low molecular weight olefin waxes, and acrylic oligomers.

Comparative Example 1

A thermoplastic gel was made using the following formula:

| Component | Weight Percent |
|---|---|
| Kaydol (white mineral oil) | 78.0 |
| Kraton G1651H | 15.0 |
| Kraton G1701M | 5.0 |
| Irganox 1076 | 1.0 |
| Irganox 1010 | 1.0 |

Figure 11:
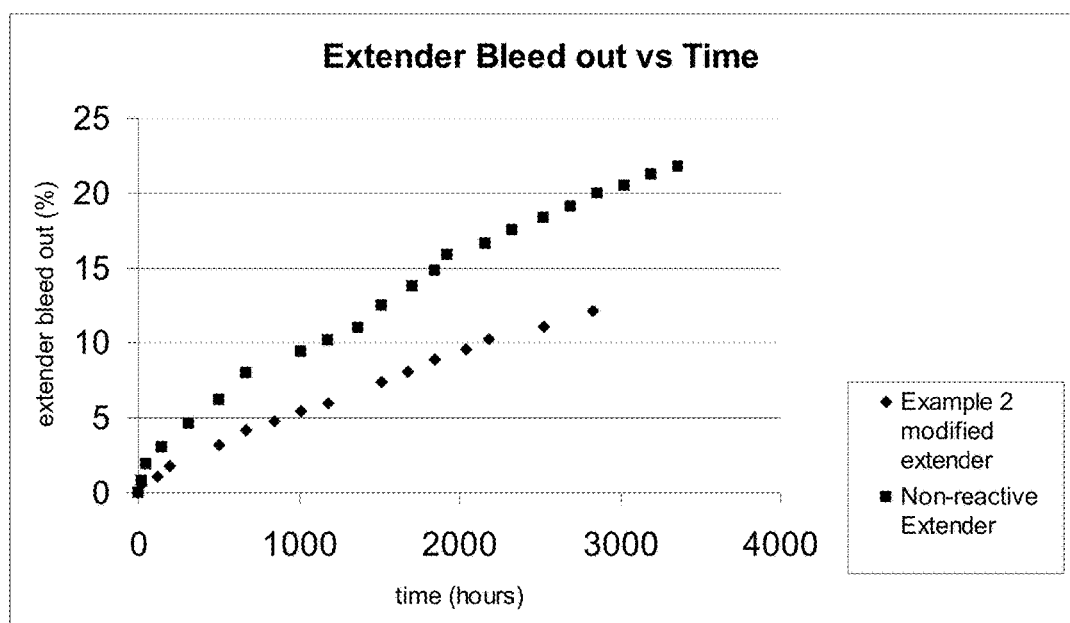
FIG. 11 is a chart illustrating extender bleed out as a function of time for two compositions under the conditions of heat (70° C.) and pressure (50 kPa or 0.5 atm).

The gel composition comprising a reactive extender (Example 2) was compared with a conventional material made with a non-reactive extender (Comparative Example 1). FIG. 11 illustrates the bleed out of the two compositions under the conditions of heat (70° C.) and pressure (50 kPa or 0.5 atm).

As shown in FIG. 11, at all times, the bleed out of extender for Example 2 was approximately half or less the bleed out of the conventional material (non-reactive extender in Comparative Example 1). A small amount of extender bleeds out in Example 2 because there was a small percentage of extender that was either non-reacted, or was not attached using the ionic crosslinking agent (AlAcAc).

Figure 12:
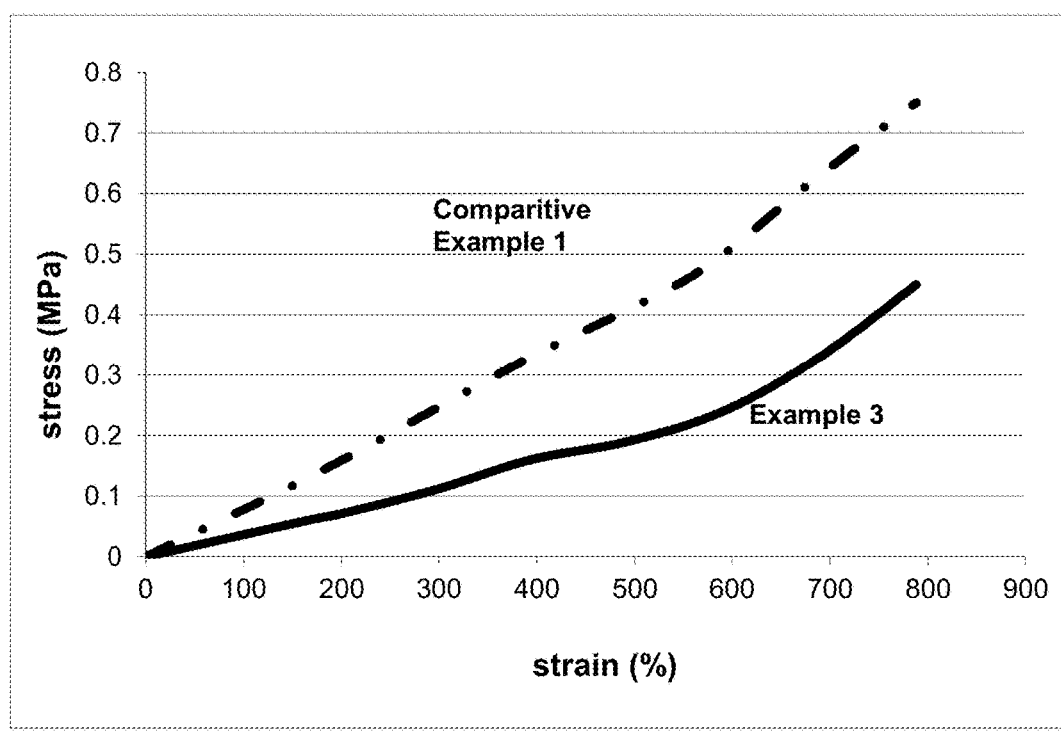
FIG. 12 is a chart illustrating the stress-strain differences between conventional and hybrid gels.

The gel composition in Comparative Example 1 was also compared with Example 3 for stress-strain performance. FIG. 12 illustrates the stress-strain differences between conventional and hybrid gels, wherein the hybrid gel has a more viscous and less elastic stress-strain curve up to approximately 600% elongation.

As shown in FIG. 12, with an increase in strain beyond the point of the elastic (linear) portion of the curve, the hybrid gel of Example 3 exhibits a somewhat exponential increase in stress prior to the failure point. In other words, the gel tends to become even stiffer with an increase in strain or pressure on the gel as it approaches its failure point.

The gels may be tested in a number of ways, such as: temperature cycling, re-entry test, sealing under water pressure, cold and hot installations, and kerosene exposure. For temperature cycling experiments, closures including the gels are exposed to temperatures between −30° C. and +60° C. for 10 days. Humidity is typically not controlled. The closures are cycled between the high and low temperatures two times a day for ten days. Samples are maintained at the extreme temperatures for four hours during each cycle.

For combined temperature cycling tests, the gels are installed in three closure systems. After installation, the closures are tested on tightness and put into temperature cycling. After eight days, a re-entry test is performed, and after ten days, the closures are taken out of cycling and tested on tightness and re-entry. Closures containing the traditional thermoplastic gels are also tested.

For tightness testing, the closure is immersed in a water bath for 15 minutes and an internal pressure of 20 kPa. If air bubbles are observed, this means the closure is not properly sealed and it will be considered as a failure.

For re-entry testing, a dummy plug or cable is removed from the closure and another cable or dummy plug is added. Then, tightness is measured again. Re-entry is successful if the closure passes the tightness test again.

In certain embodiments, the gel in the closure system may be able to pass the tightness and re-entry tests where a traditional thermoplastic elastomer gel would fail.

Although examples have been described herein, it should be appreciated that any subsequent arrangement designed to achieve the same or similar purpose may be substituted for the specific examples shown. This disclosure is intended to cover any and all subsequent adaptations or variations of various examples. Combinations of the above examples, and other examples not specifically described herein, may be apparent to those of skill in the art upon reviewing the description.

The Abstract is provided with the understanding that it will not be used to interpret or limit the scope or meaning of the claims. In addition, in the foregoing Detailed Description, various features may be grouped together or described in a single example for the purpose of streamlining the disclosure. This disclosure is not to be interpreted as reflecting an intention that the claimed examples require more features than are expressly recited in each claim. Rather, as the following claims reflect, inventive subject matter may be directed to less than all of the features of any of the disclosed examples. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other examples, which fall within the true spirit and scope of the description. Thus, to the maximum extent allowed by law, the scope is to be determined by the broadest permissible interpretation of the following claims and their equivalents, and shall not be restricted or limited by the foregoing detailed description.

The invention claimed is:

1. A method of making a hybrid thermoplastic gel comprising:
   providing a base polymer having at least one functional group capable of crosslinking, wherein the base polymer comprises a maleated styrenic block copolymer;
   providing a functionalized extender, wherein the functionalized extender is a maleated polyisobutylene;
   providing a crosslinker;
   providing heat; and
   reacting the base polymer, functionalized extender and crosslinker in the presence of the heat to form the hybrid thermoplastic gel.

2. The method of claim 1, wherein the crosslinker comprises multiple functional groups that are compatible and willing to react with the functional groups in the base polymer or functionalized extender.

3. The method of claim 1, further comprising providing at least one additive selected from the group consisting of: flame retardants, coloring agents, adhesion promoters, stabilizers, fillers, dispersants, flow improvers, plasticizers, slip agents, toughening agents, and combinations thereof.

4. The method of claim 3, comprising providing between 0.1 wt % and 5 wt % of the stabilizer.

5. The method of claim 4, wherein the stabilizer is selected from the group consisting of antioxidants, acid-scavengers, light and UV absorbers/stabilizers, heat stabilizers, metal deactivators, free radical scavengers, carbon black, antifungal agents, and mixtures thereof.

6. The method of claim 1, wherein the styrenic block copolymer is a styrene-ethylene/butylene-styrene or styrene-ethylene/propylene-styrene copolymer.

7. A method of making a hybrid thermoplastic gel comprising:
   providing a base polymer having at least one functional group capable of crosslinking, wherein the base polymer comprises a maleated styrenic block copolymer;
   providing a functionalized extender selected from the group consisting of a maleated polyisobutylene and a maleated polybutadiene, wherein the functionalized extender comprises a single olefin at a terminal position on the extender;
   providing a crosslinker;
   providing heat and
   reacting the base polymer, functionalized extender and crosslinker in the presence of the heat to form the hybrid thermoplastic gel.

8. The method of claim 1, wherein the gel comprises one or more of the following properties:
   a) a hardness between 80 g and 300 g;
   b) a stress relaxation between 20% and 65% when the gel is subjected to a deformation of 50% of its original size;
   c) a compression set between 4% and 20% after 50% strain has applied to the gel for 1000 hours at 70° C.; and
   d) less than 10% oil bleed out after being under compression of 1.2 atm for 60 days at 60° C.

9. The method of claim 1, wherein the crosslinker is a covalent crosslinker or an ionic crosslinker.

10. The method of claim 9, wherein the ionic crosslinker is an organic metal salt.

11. The method of claim 9, wherein the ionic crosslinker is selected from the group consisting of aluminum acetylacetonate, iron acetylacetonate, zinc acetylacetonate, titanium acetylacetonate and zirconium acetylacetonate, aluminum triacetate, aluminium diacetate, aluminium monoacetate, tetra(2-ethylhexyl)titanate, and mixtures thereof.

12. The method of making a hybrid thermoplastic gel according to claim 1, comprising
   mixing a gel composition at an elevated temperature, wherein the gel composition comprises, compared to the weight of the overall gel composition:
   5-40 wt % of the base polymer having at least one functional group capable of crosslinking, wherein the base polymer comprises a maleated styrenic block copolymer;
   60-95 wt % of the functionalized extender, wherein the functionalized extender is a maleated polyisobutylene; and
   the crosslinker.

13. The method of making a hybrid thermoplastic gel according to claim 12, wherein the gel composition comprises 0.1-5 wt % of the crosslinker.

14. The method of making a hybrid thermoplastic gel according to claim 12, wherein the gel composition further comprises a styrenic block copolymer selected from the group consisting of a
   polystyrene-poly(ethylene-propylene) diblock copolymer,
   a polystyrene-poly(ethylene-butylene)-polystyrene triblock copolymer,
   a polystyrene-poly(ethylene-butylene-styrene)-polystyrene triblock copolymer,
   a polystyrene-poly(ethylene-propylene)-polystyrene triblock copolymer,
   a polystyrene-polybutadiene-poly(styrene-butadiene)-polybutadiene block copolymer, and
   a polystyrene-poly(ethylene-ethylene/propylene)-polystyrene triblock copolymer.

15. The method of claim 7, wherein the crosslinker comprises multiple functional groups that are compatible and willing to react with the functional groups in the base polymer or functionalized extender.

16. The method of claim 7, further comprising providing at least one additive selected from the group consisting of: flame retardants, coloring agents, adhesion promoters, stabilizers, fillers, dispersants, flow improvers, plasticizers, slip agents, toughening agents, and combinations thereof.

17. The method of claim 16, comprising providing between 0.1 wt % and 5 wt % of the stabilizer.

18. The method of claim 17, wherein the stabilizer is selected from the group consisting of antioxidants, acid-scavengers, light and UV absorbers/stabilizers, heat stabilizers, metal deactivators, free radical scavengers, carbon black, antifungal agents, and mixtures thereof.

19. The method of claim 7, wherein the styrenic block copolymer is a styrene-ethylene/butylene-styrene or styrene-ethylene/propylene-styrene copolymer.

20. The method of claim 7, wherein the gel comprises one or more of the following properties:
   a) a hardness between 80 g and 300 g;
   b) a stress relaxation between 20% and 65% when the gel is subjected to a deformation of 50% of its original size;
   c) a compression set between 4% and 20% after 50% strain has applied to the gel for 1000 hours at 70° C.; and d) less than 10% oil bleed out after being under compression of 1.2 atm for 60 days at 60° C.

21. The method of claim 7, wherein the crosslinker is a covalent crosslinker or an ionic crosslinker.

22. The method of claim 21, wherein the ionic crosslinker is an organic metal salt.

23. The method of claim 21, wherein the ionic crosslinker is selected from the group consisting of aluminum acetylacetonate, iron acetylacetonate, zinc acetylacetonate, titanium acetylacetonate and zirconium acetylacetonate, aluminum triacetate, aluminium diacetate, aluminium monoacetate, tetra(2-ethylhexyl)titanate, and mixtures thereof.

24. The method of making a hybrid thermoplastic gel according to claim 7, comprising
mixing a gel composition at an elevated temperature, wherein the gel composition comprises, compared to the weight of the overall gel composition:
5-40 wt % of the base polymer having at least one functional group capable of crosslinking, wherein the base polymer comprises a maleated styrenic block copolymer;
60-95 wt % of the functionalized extender selected from the group consisting of a maleated polyisobutylene and a maleated polybutadiene; and
the crosslinker.

25. The method of making a hybrid thermoplastic gel according to claim 24, wherein the gel composition comprises 0.1-5 wt % of the crosslinker.

26. The method of making a hybrid thermoplastic gel according to claim 24, wherein the gel composition further comprises a styrenic block copolymer selected from the group consisting of a
polystyrene-poly(ethylene-propylene) diblock copolymer,
a polystyrene-poly(ethylene-butylene)-polystyrene triblock copolymer,
a polystyrene-poly(ethylene-butylene-styrene)-polystyrene triblock copolymer,
a polystyrene-poly(ethylene-propylene)-polystyrene triblock copolymer,
a polystyrene-polybutadiene-poly(styrene-butadiene)-polybutadiene block copolymer, and
a polystyrene-poly(ethylene-ethylene/propylene)-polystyrene triblock copolymer.

* * * * *